(12) United States Patent
Ray et al.

(10) Patent No.: US 10,304,551 B2
(45) Date of Patent: May 28, 2019

(54) ERASE SPEED BASED WORD LINE CONTROL

(71) Applicant: SanDisk Technologies LLC, Plano, TX (US)

(72) Inventors: Biswajit Ray, Santa Clara, CA (US); Mohan Dunga, Santa Clara, CA (US); Gerrit Jan Hemink, San Ramon, CA (US); Changyuan Chen, San Ramon, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 303 days.

(21) Appl. No.: 15/194,295

(22) Filed: Jun. 27, 2016

(65) Prior Publication Data

US 2017/0372789 A1 Dec. 28, 2017

(51) Int. Cl.
*G11C 16/06* (2006.01)
*G11C 16/34* (2006.01)
*G11C 16/04* (2006.01)
*G11C 16/08* (2006.01)
*G11C 16/16* (2006.01)

(52) U.S. Cl.
CPC ...... *G11C 16/3445* (2013.01); *G11C 16/0483* (2013.01); *G11C 16/08* (2013.01); *G11C 16/16* (2013.01)

(58) Field of Classification Search
CPC ..... G11C 16/0483; G11C 16/16; G11C 16/10; G11C 16/3445; G11C 16/26; G11C 16/14; G11C 11/5642; G11C 16/3459; G11C 11/5635; G11C 2211/5621; G11C 2211/5642

See application file for complete search history.

(56) References Cited

U.S. PATENT DOCUMENTS

| | | | |
|---|---|---|---|
| 7,397,706 B2 | 7/2008 | Byeon et al. | |
| 7,778,084 B2* | 8/2010 | Kim | G11C 11/5628 365/185.17 |
| 8,599,617 B2* | 12/2013 | Shiino | G11C 11/5635 365/185.14 |
| 8,824,211 B1 | 9/2014 | Costa et al. | |
| 2007/0047327 A1* | 3/2007 | Goda | G11C 8/08 365/185.29 |
| 2007/0047328 A1* | 3/2007 | Kim | G11C 16/0483 365/185.29 |
| 2016/0104540 A1* | 4/2016 | Lee | G11C 16/3445 365/185.12 |

* cited by examiner

*Primary Examiner* — Hien N Nguyen
(74) *Attorney, Agent, or Firm* — Kunzler Bean & Adamson, PC

(57) ABSTRACT

Apparatuses, systems, methods, and computer program products are disclosed for erase depth control. One apparatus includes a block of non-volatile storage cells. A controller is configured to perform a first erase operation on a block of non-volatile storage cells. A controller for a block is configured to determine a first set of storage cells of the block having a faster erase speed than a second set of storage cells of the block based on a verify voltage threshold. A controller for a block is configured to perform a second erase operation on the block using different voltages for a first set of storage cells and a second set of storage cells of the block.

12 Claims, 12 Drawing Sheets

ERASE SPEED BASED WORD LINE CONTROL

TECHNICAL FIELD

The present disclosure, in various embodiments, relates to storage devices and more particularly relates to erase speed based word line control for storage devices.

BACKGROUND

Many data storage devices, such as flash memory devices, store data in cells of non-volatile media. A physical property of each cell, such as a stored charge, voltage, material phase, electrical resistance, magnetization, or the like, is alterable to encode data. A cell's physical property may be variable across a range, which may be divided into discrete states, so that different states correspond to different data values. Sensing whether the cell's physical property satisfies one or more read thresholds (e.g., voltage thresholds, resistivity thresholds, or the like) within its range determines the cell's state, thus allowing recovery of a stored data value.

The data-encoding physical property of a cell may vary over time due to cell damage, charge leakage, temperature effects, disturbances from nearby cells, manufacturing differences, or the like. For example, a speed for erasing a cell's state may vary between cells. As storage density increases, feature size shrinks, making the cells more susceptible to such differences.

SUMMARY

Apparatuses are presented for erase depth control. In one embodiment, an apparatus includes a block of non-volatile storage cells. A controller for a block, in certain embodiments, is configured to perform a first erase operation on the block of non-volatile storage cells. A controller, in one embodiment, is configured to determine a first set of storage cells of a block having a faster erase speed than a second set of storage cells of the block based on a verify voltage threshold. In some embodiments, a controller is configured to perform a second erase operation on a block of non-volatile storage cells using different voltages for a first set of storage cells and a second set of storage cells of the block.

Methods are presented for erase depth control. A method, in one embodiment, includes performing a first portion of an erase operation on a plurality of word lines using a first voltage profile. In a further embodiment, a method includes performing a first erase verify on a plurality of word lines. A method, in certain embodiments, includes determining a first group of word lines of a plurality of word lines having a lower threshold voltage than a second group of word lines of the plurality of word lines based on a first erase verify. In some embodiments, a method includes performing a second portion of an erase operation on a plurality of word lines. In one embodiment, a second voltage profile is used during a second portion of an erase operation for a first group of word lines and a third voltage profile is used during a second portion of an erase operation for a second group of word lines, and the second voltage profile and third voltage profile are different.

An apparatus for erase depth control, in one embodiment, includes means for performing a first erase on a plurality of word lines using a first voltage profile until a pre-erase verify voltage threshold is satisfied. In certain embodiments, an apparatus includes means for determining a first group of word lines of a plurality of word lines having a shorter erase duration time and/or a faster erase speed than a second group of word lines of the plurality of word lines based on a different erase verify voltage threshold. In various embodiments, an apparatus includes means for performing a second erase operation on a plurality of word lines. In one embodiment, a second voltage profile is used during a second erase operation for a first group of word lines and a third voltage profile is used during the second erase operation for a second group of word lines, and the second voltage profile and third voltage profile are different.

BRIEF DESCRIPTION OF THE DRAWINGS

A more particular description is included below with reference to specific embodiments illustrated in the appended drawings. Understanding that these drawings depict only certain embodiments of the disclosure and are not therefore to be considered to be limiting of its scope, the disclosure is described and explained with additional specificity and detail through the use of the accompanying drawings, in which.

DETAILED DESCRIPTION

Figure 1A:
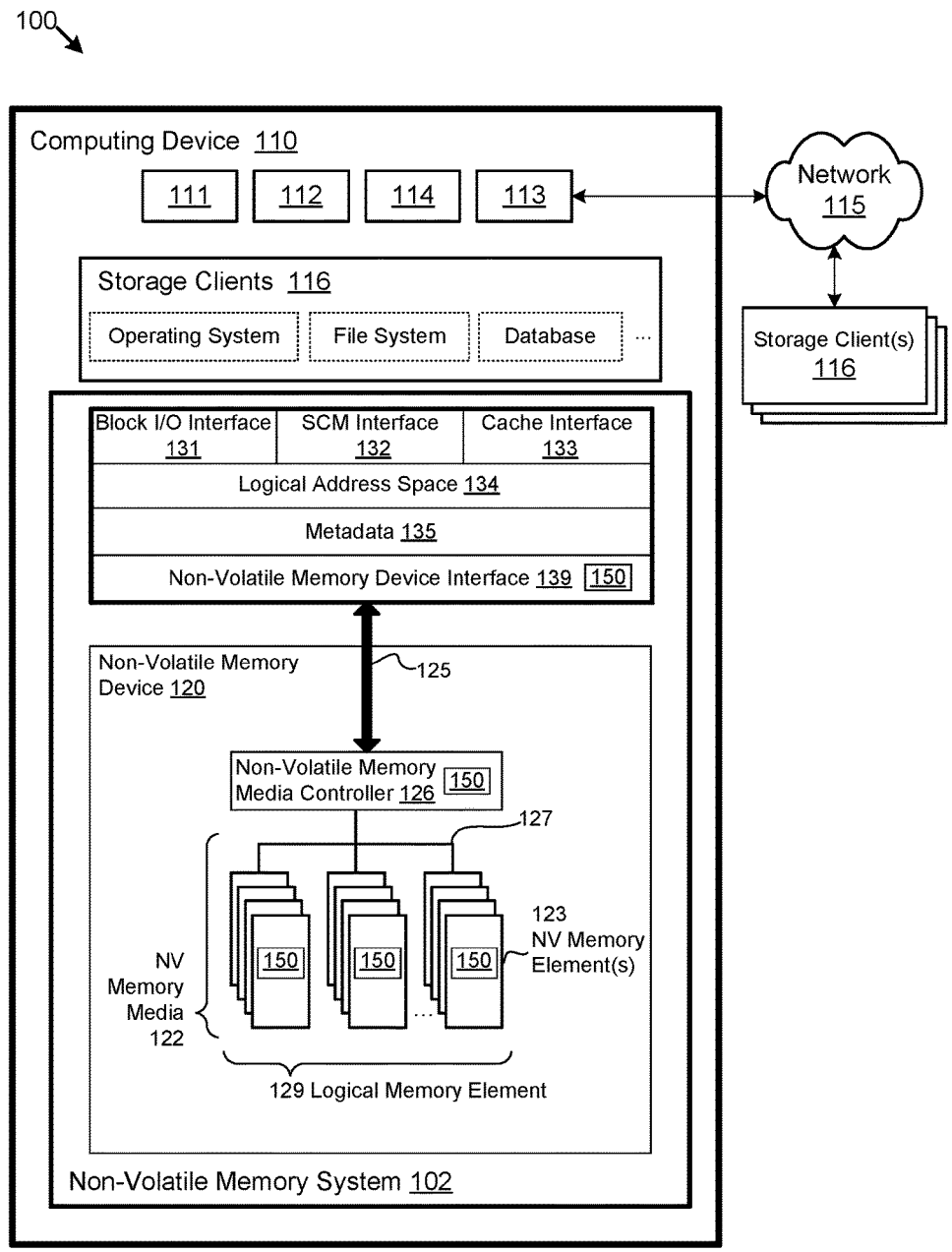
FIG. 1A is a schematic block diagram illustrating one embodiment of a system for erase depth control.

Aspects of the present disclosure may be embodied as an apparatus, system, method, or computer program product. Accordingly, aspects of the present disclosure may take the form of an entirely hardware embodiment, an entirely software embodiment (including firmware, resident software, micro-code, or the like) or an embodiment combining software and hardware aspects that may all generally be referred to herein as a "circuit," "module," "apparatus," or "system." Furthermore, aspects of the present disclosure may take the form of a computer program product embodied in one or more non-transitory computer readable storage media storing computer readable and/or executable program code.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices, or the like.

Modules may also be implemented at least partially in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may include a single instruction, or many instructions, and may even be distributed over several different code segments, among different programs, across several memory devices, or the like. Where a module or portions of a module are implemented in software, the software portions may be stored on one or more computer readable and/or executable storage media. Any combination of one or more computer readable storage media may be utilized. A computer readable storage medium may include, for example, but not limited to, an electronic, magnetic, optical, electromagnetic, infrared, or semiconductor system, apparatus, or device, or any suitable combination of the foregoing, but would not include propagating signals. In the context of this document, a computer readable and/or executable storage medium may be any tangible and/or non-transitory medium that may contain or store a program for use by or in connection with an instruction execution system, apparatus, processor, or device.

Computer program code for carrying out operations for aspects of the present disclosure may be written in any combination of one or more programming languages, including an object oriented programming language such as Python, Java, Smalltalk, C++, C#, Objective C, or the like, conventional procedural programming languages, such as the "C" programming language, scripting programming languages, and/or other similar programming languages. The program code may execute partly or entirely on one or more of a user's computer and/or on a remote computer or server over a data network or the like.

A component, as used herein, comprises a tangible, physical, non-transitory device. For example, a component may be implemented as a hardware logic circuit comprising custom VLSI circuits, gate arrays, or other integrated circuits; off-the-shelf semiconductors such as logic chips, transistors, or other discrete devices; and/or other mechanical or electrical devices. A component may also be implemented in programmable hardware devices such as field programmable gate arrays, programmable array logic, programmable logic devices, or the like. A component may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may alternatively be embodied by or implemented as a component.

Reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

In the following detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure may refer to elements of proceeding figures Like numbers may refer to like elements in the figures, including alternate embodiments of like elements.

FIG. 1A is a block diagram of one embodiment of a system 100 comprising an erase depth control component 150 for a non-volatile memory device 120. The erase depth control component 150 may be part of and/or in communication with a non-volatile memory media controller 126, a non-volatile memory element 123, a device driver, or the like. The erase depth control component 150 may operate on a non-volatile memory system 102 of a computing device 110, which may comprise a processor 111, volatile memory 112, and a communication interface 113. The processor 111 may comprise one or more central processing units, one or more general-purpose processors, one or more application-specific processors, one or more virtual processors (e.g., the computing device 110 may be a virtual machine operating within a host), one or more processor cores, or the like. The communication interface 113 may comprise one or more network interfaces configured to communicatively couple the computing device 110 and/or non-volatile memory controller 126 to a communication network 115, such as an Internet Protocol (IP) network, a Storage Area Network (SAN), wireless network, wired network, or the like.

The non-volatile memory device 120, in various embodiments, may be disposed in one or more different locations relative to the computing device 110. In one embodiment, the non-volatile memory device 120 comprises one or more non-volatile memory elements 123, such as semiconductor chips or packages or other integrated circuit devices disposed on one or more printed circuit boards, storage housings, and/or other mechanical and/or electrical support structures. For example, the non-volatile memory device 120 may comprise one or more direct inline memory module (DIMM) cards, one or more expansion cards and/or daughter cards, a solid-state-drive (SSD) or other hard drive device, and/or may have another memory and/or storage form factor. The non-volatile memory device 120 may be integrated with and/or mounted on a motherboard of the computing device 110, installed in a port and/or slot of the computing device 110, installed on a different computing device 110 and/or a dedicated storage appliance on the network 115, in communication with the computing device 110 over an external bus (e.g., an external hard drive), or the like.

The non-volatile memory device 120, in one embodiment, may be disposed on a memory bus of a processor 111 (e.g., on the same memory bus as the volatile memory 112, on a different memory bus from the volatile memory 112, in place of the volatile memory 112, or the like). In a further embodiment, the non-volatile memory device 120 may be disposed on a peripheral bus of the computing device 110, such as a peripheral component interconnect express (PCI Express or PCIe) bus, a serial Advanced Technology Attachment (SATA) bus, a parallel Advanced Technology Attachment (PATA) bus, a small computer system interface (SCSI) bus, a FireWire bus, a Fibre Channel connection, a Universal Serial Bus (USB), a PCIe Advanced Switching (PCIe-AS) bus, or the like. In another embodiment, the non-volatile memory device 120 may be disposed on a data network 115, such as an Ethernet network, an Infiniband network, SCSI RDMA over a network 115, a storage area network (SAN), a local area network (LAN), a wide area network (WAN) such as the Internet, another wired and/or wireless network 115, or the like.

The computing device 110 may further comprise a non-transitory, computer readable storage medium 114. The computer readable storage medium 114 may comprise executable instructions configured to cause the computing device 110 (e.g., processor 111) to perform steps of one or more of the methods disclosed herein. Alternatively, or in addition, the erase depth control component 150 may be embodied as one or more computer readable instructions stored on the non-transitory storage medium 114.

The non-volatile memory system 102, in the depicted embodiment, includes an erase depth control component 150. The erase depth control component 150, in one embodiment, is configured to manage a sequence of erasing data for the non-volatile memory device 120 described below. The erase depth control component 150, in certain embodiments, may perform a first erase operation on a block of non-volatile storage cells using a first voltage applied for a first time period and a pre-erase verify voltage threshold. The erase depth control component 150 may also determine a first set of storage cells of the block having a lower erase duration time and/or faster erase speed than a second set of storage cells of the block based on a verify voltage threshold (e.g., an erase verify voltage threshold defining or otherwise associated with an erase state, a pre-erase verify voltage threshold, a second pre-erase verify voltage threshold lower than a first pre-erase verify voltage threshold used to verify a first erase operation or portion thereof, or the like). The erase depth control component 150 may perform a second erase operation on the block of non-volatile storage cells using different voltages for the first set of storage cells and the second set of storage cells of the block. Thus, variance in erase depth for storage cells may be compensated for in a way that reduces storage cell degradation.

In one embodiment, the erase depth control component 150 may comprise logic hardware of one or more non-volatile memory devices 120, such as a non-volatile memory media controller 126, a non-volatile memory element 123, a device controller, a field-programmable gate array (FPGA) or other programmable logic, firmware for an FPGA or other programmable logic, microcode for execution on a micro-controller, an application-specific integrated circuit (ASIC), or the like. In another embodiment, the erase depth control component 150 may comprise executable software code, such as a device driver or the like, stored on the computer readable storage medium 114 for execution on the processor 111. In a further embodiment, the erase depth control component 150 may include a combination of both executable software code and logic hardware.

In one embodiment, the erase depth control component 150 is configured to receive storage requests from a device driver or other executable application via a bus 125 or the like. The erase depth control component 150 may be further configured to transfer data to/from a device driver and/or storage clients 116 via the bus 125. Accordingly, the erase depth control component 150, in some embodiments, may comprise and/or be in communication with one or more direct memory access (DMA) modules, remote DMA modules, bus controllers, bridges, buffers, and so on to facilitate the transfer of storage requests and associated data. In another embodiment, the erase depth control component 150 may receive storage requests as an API call from a storage client 116, as an IO-CTL command, or the like.

According to various embodiments, a non-volatile memory controller 126 in communication with one or more program sequencing components 150 may manage one or more non-volatile memory devices 120 and/or non-volatile memory elements 123. The non-volatile memory device(s) 120 may comprise recording, memory, and/or storage devices, such as solid-state storage device(s) and/or semi-conductor storage device(s) that are arranged and/or partitioned into a plurality of addressable media storage locations. As used herein, a media storage location refers to any physical unit of memory (e.g., any quantity of physical storage media on a non-volatile memory device 120). Memory units may include, but are not limited to: pages, memory divisions, blocks, sectors, collections or sets of physical storage locations (e.g., logical pages, logical blocks), or the like.

A device driver and/or the non-volatile memory media controller 126, in certain embodiments, may present a logical address space 134 to the storage clients 116. As used herein, a logical address space 134 refers to a logical representation of memory resources. The logical address space 134 may comprise a plurality (e.g., range) of logical addresses. As used herein, a logical address refers to any identifier for referencing a memory resource (e.g., data), including, but not limited to: a logical block address (LBA), cylinder/head/sector (CHS) address, a file name, an object identifier, an inode, a Universally Unique Identifier (UUID), a Globally Unique Identifier (GUID), a hash code, a signature, an index entry, a range, an extent, or the like.

A device driver for the non-volatile memory device 120 may maintain metadata 135, such as a logical to physical address mapping structure, to map logical addresses of the logical address space 134 to media storage locations on the non-volatile memory device(s) 120. A device driver may be configured to provide storage services to one or more storage clients 116. The storage clients 116 may include local storage clients 116 operating on the computing device 110 and/or remote, storage clients 116 accessible via the network 115 and/or network interface 113. The storage clients 116 may include, but are not limited to: operating systems, file systems, database applications, server applications, kernel-level processes, user-level processes, applications, and the like.

A device driver may be communicatively coupled to one or more non-volatile memory devices 120. The one or more non-volatile memory devices 120 may include different types of non-volatile memory devices including, but not limited to: solid-state storage devices, semiconductor storage devices, SAN storage resources, or the like. The one or more non-volatile memory devices 120 may comprise one or more respective non-volatile memory media controllers 126 and non-volatile memory media 122. A device driver may provide access to the one or more non-volatile memory devices 120 via a traditional block I/O interface 131. Additionally, a device driver may provide access to enhanced functionality through the SCM interface 132. The metadata 135 may be used to manage and/or track data operations performed through any of the Block I/O interface 131, SCM interface 132, cache interface 133, or other, related interfaces.

The cache interface 133 may expose cache-specific features accessible via a device driver for the non-volatile memory device 120. Also, in some embodiments, the SCM interface 132 presented to the storage clients 116 provides access to data transformations implemented by the one or more non-volatile memory devices 120 and/or the one or more non-volatile memory media controllers 126.

A device driver may present a logical address space 134 to the storage clients 116 through one or more interfaces. As discussed above, the logical address space 134 may comprise a plurality of logical addresses, each corresponding to respective media locations on one or more non-volatile memory devices 120. A device driver may maintain metadata 135 comprising any-to-any mappings between logical addresses and media locations, or the like.

A device driver may further comprise and/or be in communication with a non-volatile memory device interface 139 configured to transfer data, commands, and/or queries to the one or more non-volatile memory devices 120 over a bus 125, which may include, but is not limited to: a memory bus of a processor 111, a peripheral component interconnect express (PCI Express or PCIe) bus, a serial Advanced Technology Attachment (ATA) bus, a parallel ATA bus, a small computer system interface (SCSI), FireWire, Fibre Channel, a Universal Serial Bus (USB), a PCIe Advanced Switching (PCIe-AS) bus, a network 115, Infiniband, SCSI RDMA, or the like. The non-volatile memory device interface 139 may communicate with the one or more non-volatile memory devices 120 using input-output control (IO-CTL) command(s), IO-CTL command extension(s), remote direct memory access, or the like.

The communication interface 113 may comprise one or more network interfaces configured to communicatively couple the computing device 110 and/or the non-volatile memory controller 126 to a network 115 and/or to one or more remote, network-accessible storage clients 116. The storage clients 116 may include local storage clients 116 operating on the computing device 110 and/or remote, storage clients 116 accessible via the network 115 and/or the network interface 113. The non-volatile memory controller 126 is part of and/or in communication with one or more non-volatile memory devices 120. Although FIG. 1A depicts a single non-volatile memory device 120, the disclosure is not limited in this regard and could be adapted to incorporate any number of non-volatile memory devices 120.

The non-volatile memory device 120 may comprise one or more elements 123 of non-volatile memory media 122, which may include but is not limited to: ReRAM, Memristor memory, programmable metallization cell memory, phase-change memory (PCM, PCME, PRAM, PCRAM, ovonic unified memory, chalcogenide RAM, or C-RAM), NAND flash memory (e.g., 2D NAND flash memory, 3D NAND flash memory), NOR flash memory, nano random access memory (nano RAM or NRAM), nanocrystal wire-based memory, silicon-oxide based sub-10 nanometer process memory, graphene memory, Silicon-Oxide-Nitride-Oxide-Silicon (SONOS), programmable metallization cell (PMC), conductive-bridging RAM (CBRAM), magneto-resistive RAM (MRAM), magnetic storage media (e.g., hard disk, tape), optical storage media, or the like. The one or more elements 123 of non-volatile memory media 122, in certain embodiments, comprise storage class memory (SCM).

While legacy technologies such as NAND flash may be block and/or page addressable, storage class memory, in one embodiment, is byte addressable. In further embodiments, storage class memory may be faster and/or have a longer life (e.g., endurance) than NAND flash; may have a lower cost, use less power, and/or have a higher storage density than DRAM; or offer one or more other benefits or improvements when compared to other technologies. For example, storage class memory may comprise one or more non-volatile memory elements 123 of ReRAM, Memristor memory, programmable metallization cell memory, phase-change memory, nano RAM, nanocrystal wire-based memory, silicon-oxide based sub-10 nanometer process memory, graphene memory, SONOS memory, PMC memory, CBRAM, MRAM, and/or variations thereof.

While the non-volatile memory media 122 is referred to herein as "memory media," in various embodiments, the non-volatile memory media 122 may more generally comprise one or more non-volatile recording media capable of recording data, which may be referred to as a non-volatile memory medium, a non-volatile storage medium, or the like. Further, the non-volatile memory device 120, in various embodiments, may comprise a non-volatile recording device, a non-volatile memory device, a non-volatile storage device, or the like.

The non-volatile memory media 122 may comprise one or more non-volatile memory elements 123, which may include, but are not limited to: chips, packages, planes, die, or the like. A non-volatile memory media controller 126 may be configured to manage data operations on the non-volatile memory media 122, and may comprise one or more processors, programmable processors (e.g., FPGAs), ASICs, micro-controllers, or the like. In some embodiments, the non-volatile memory media controller 126 is configured to store data on and/or read data from the non-volatile memory media 122, to transfer data to/from the non-volatile memory device 120, and so on.

The non-volatile memory media controller 126 may be communicatively coupled to the non-volatile memory media 122 by way of a bus 127. The bus 127 may comprise an I/O bus for communicating data to/from the non-volatile memory elements 123. The bus 127 may further comprise a control bus for communicating addressing and other command and control information to the non-volatile memory elements 123. In some embodiments, the bus 127 may communicatively couple the non-volatile memory elements 123 to the non-volatile memory media controller 126 in parallel. This parallel access may allow the non-volatile memory elements 123 to be managed as a group, forming a logical memory element 129. The logical memory element may be partitioned into respective logical memory units (e.g., logical pages) and/or logical memory divisions (e.g., logical blocks). The logical memory units may be formed by logically combining physical memory units of each of the non-volatile memory elements.

The non-volatile memory controller 126 may organize a block of word lines within a non-volatile memory element 123, in certain embodiments, using addresses of the word lines, such that the word lines are logically organized into a monotonically increasing sequence (e.g., decoding and/or translating addresses for word lines into a monotonically increasing sequence, or the like). In a further embodiment, word lines of a block within a non-volatile memory element 123 may be physically arranged in a monotonically increasing sequence of word line addresses, with consecutively addressed word lines also being physically adjacent (e.g., WL0, WL1, WL2, . . . WLN).

The non-volatile memory controller 126 may comprise and/or be in communication with a device driver executing on the computing device 110. A device driver may provide storage services to the storage clients 116 via one or more interfaces 131, 132, and/or 133. In some embodiments, a device driver provides a block-device I/O interface 131 through which storage clients 116 perform block-level I/O operations. Alternatively, or in addition, a device driver may provide a storage class memory (SCM) interface 132, which may provide other storage services to the storage clients 116. In some embodiments, the SCM interface 132 may comprise extensions to the block device interface 131 (e.g., storage clients 116 may access the SCM interface 132 through extensions or additions to the block device interface 131). Alternatively, or in addition, the SCM interface 132 may be provided as a separate API, service, and/or library. A device driver may be further configured to provide a cache interface 133 for caching data using the non-volatile memory system 102.

A device driver may further comprise a non-volatile memory device interface 139 that is configured to transfer data, commands, and/or queries to the non-volatile memory media controller 126 over a bus 125, as described above.

Figure 1B:
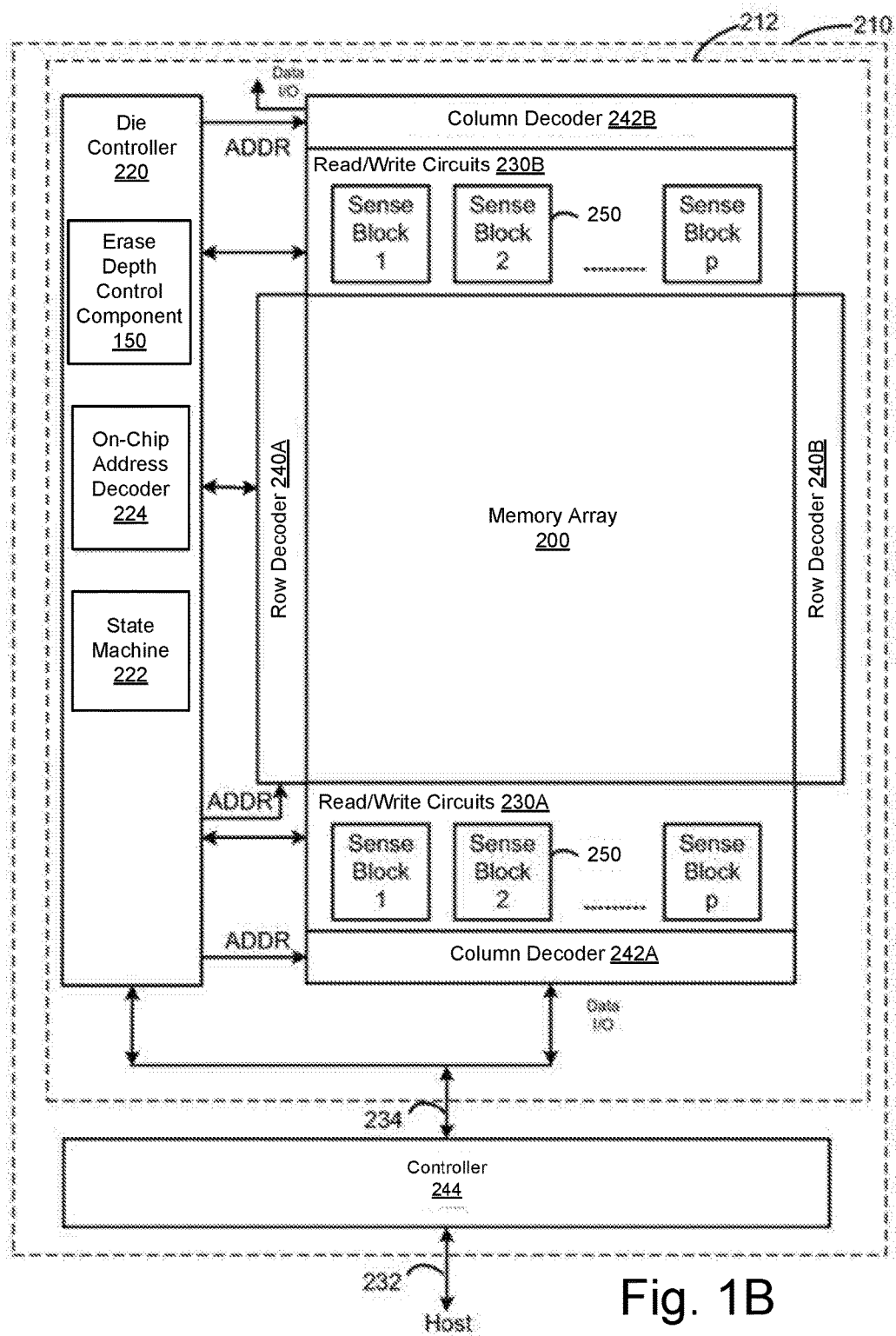
FIG. 1B is a schematic block diagram illustrating another embodiment of a system for erase depth control.

FIG. 1B illustrates an embodiment of a non-volatile storage device 210 that may include one or more memory die or chips 212. Memory die 212, in some embodiments, includes an array (two-dimensional or three dimensional) of memory cells 200, die controller 220, and read/write circuits 230A/230B. In one embodiment, access to the memory array 200 by the various peripheral circuits is implemented in a symmetric fashion, on opposite sides of the array, so that the densities of access lines and circuitry on each side are reduced by half. The read/write circuits 230A/230B, in a further embodiment, include multiple sense blocks 250 which allow a page of memory cells to be read or programmed in parallel.

The memory array 200, in various embodiments, is addressable by word lines via row decoders 240A/240B and by bit lines via column decoders 242A/242B. In some embodiments, a controller 244 is included in the same memory device 210 (e.g., a removable storage card or package) as the one or more memory die 212. Commands and data are transferred between the host and controller 244 via lines 232 and between the controller and the one or more memory die 212 via lines 234. One implementation can include multiple chips 212.

Die controller 220, in one embodiment, cooperates with the read/write circuits 230A/230B to perform memory operations on the memory array 200. The die controller 220, in certain embodiments, includes an erase depth control component 150, a state machine 222, and an on-chip address decoder 224. In one embodiment, the state machine 222 comprises at least a portion of the erase depth control component 150. In a further embodiment, the controller 244 comprises at least a portion of the erase depth control component 150.

The erase depth control component 150, in one embodiment, is configured to perform a first portion of an erase operation on a plurality of word lines using a first voltage profile, perform a first erase verify on the plurality of word lines using a pre-erase verify voltage profile, determine a first group of word lines of the plurality of word lines having a lower threshold voltage than a second group of word lines of the plurality of word lines based on the first erase verify, and perform a second portion of the erase operation on the plurality of word lines. In such an embodiment, a second voltage profile is used during the second portion of the erase operation for the first group of word lines and a third voltage profile is used during the second portion of the erase operation for the second group of word lines, and the second voltage profile and third voltage profile are different.

The state machine 222, in one embodiment, provides chip-level control of memory operations. The on-chip address decoder 224 provides an address interface to convert between the address that is used by the host or a memory controller to the hardware address used by the decoders 240A, 240B, 242A, 242B. In certain embodiments, the state machine 222 includes an embodiment of the erase depth control component 150. The erase depth control component 150, in some embodiments, determines a word line erase profile for a word line based on a prior erase of the word line in order to perform an erase speed based erase on the word line. The erase depth control component 150, in certain embodiments, is embodied as software in a device driver, hardware in a device controller 244, and/or hardware in a die controller 220 and/or state machine 222.

In one embodiment, one or any combination of die controller 220, erase depth control component 150, decoder circuit 224, state machine circuit 222, decoder circuit 242A, decoder circuit 242B, decoder circuit 240A, decoder circuit 240B, read/write circuits 230A, read/write circuits 230B, and/or controller 244 can be referred to as one or more managing circuits.

Figure 2:
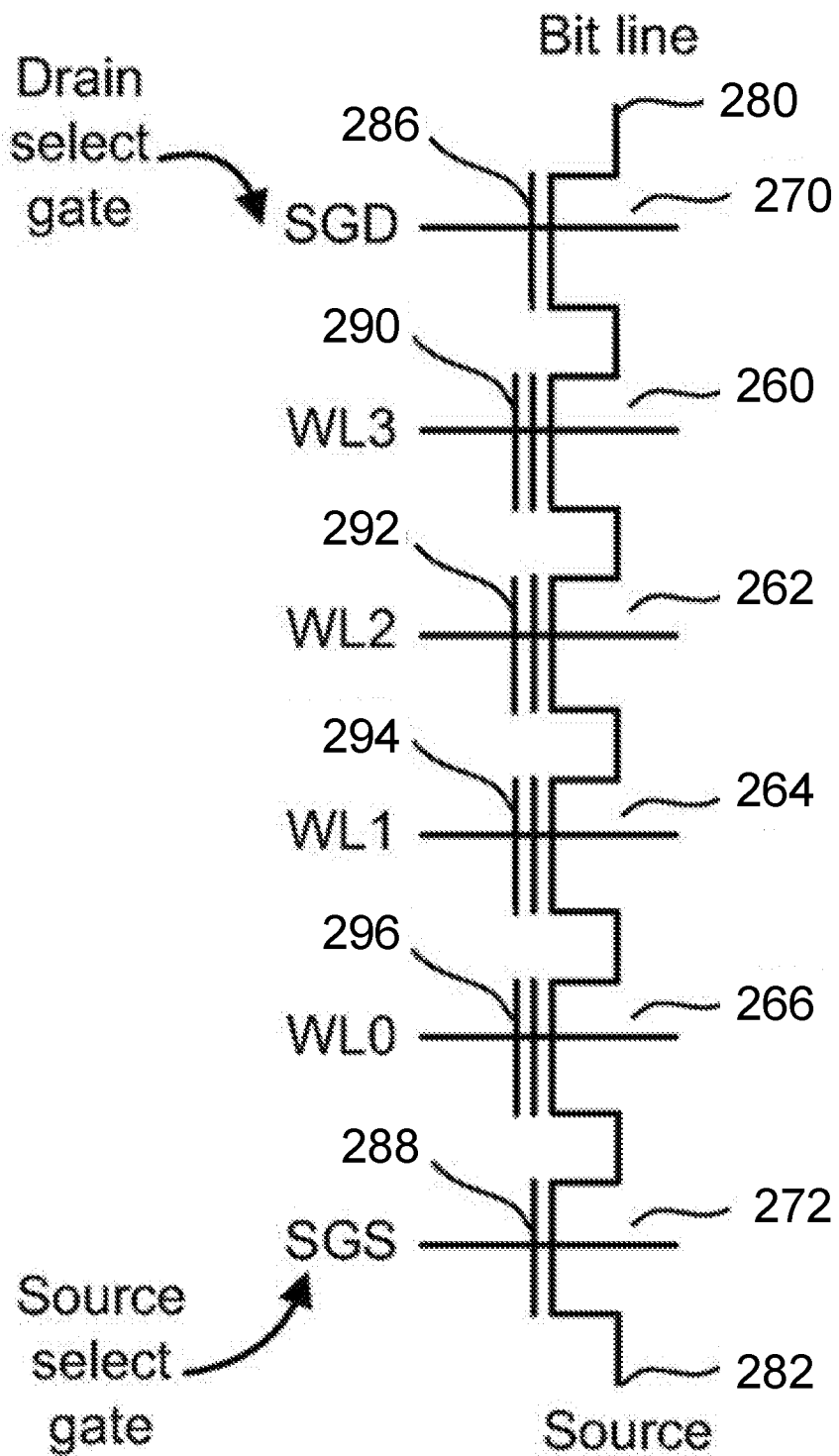
FIG. 2 is a schematic block diagram illustrating one embodiment of a string of storage cells.

FIG. 2 depicts one embodiment of a NAND string comprising a plurality of storage elements. The NAND string depicted in FIG. 2, in some embodiments, includes four transistors 260, 262, 264, 266 connected in series and located between a first select transistor 270 and a second select transistor 272. In some embodiments, a transistor 260, 262, 264, 266 includes a control gate and a floating gate. A control gate 290, 292, 294, 296, in one embodiment, is connected to, or comprises a portion of, a word line. In a further embodiment, a transistor 260, 262, 264, 266 is a storage element, storage cell, or the like, also referred to as a memory cell. In some embodiments, a storage element may include multiple transistors 260, 262, 264, 266.

The first select transistor 270, in some embodiments, gates/connects the NAND string connection to a bit line 280 via a drain select gate SGD. The second select transistor 272, in certain embodiments, gates/connects the NAND string connection to a source line 282 via a source select gate SGS. The first select transistor 270, in a further embodiment, is controlled by applying a voltage to a corresponding select gate 286. The second select transistor 272, in some embodiments, is controlled by applying a voltage to corresponding select gate 288.

As shown in FIG. 2, the source line 282, in one embodiment, is connected to the sources of each transistor/storage cell 260, 262, 264, 266 in the NAND string. The NAND string, in some embodiments, may include some storage elements 260, 262, 264, 266 that have been programmed and some storage elements 260, 262, 264, 266 that have not been programmed. As described in more detail below, the erase depth control component 150 determines an erase profile for the storage elements 260, 262, 264, 266. The erase profile may depend on an erase speed of the storage elements 260, 262, 264, 266 and may be selected to result in a number of errors that is less than a predetermined threshold. The erase depth control component 150, in some embodiments, may determine the erase profile based on a prior erase. In a further embodiment, the erase depth control component 150 performs an erase on storage elements 260, 262, 264, 266 by applying the erase profile to a word line.

Figure 3:
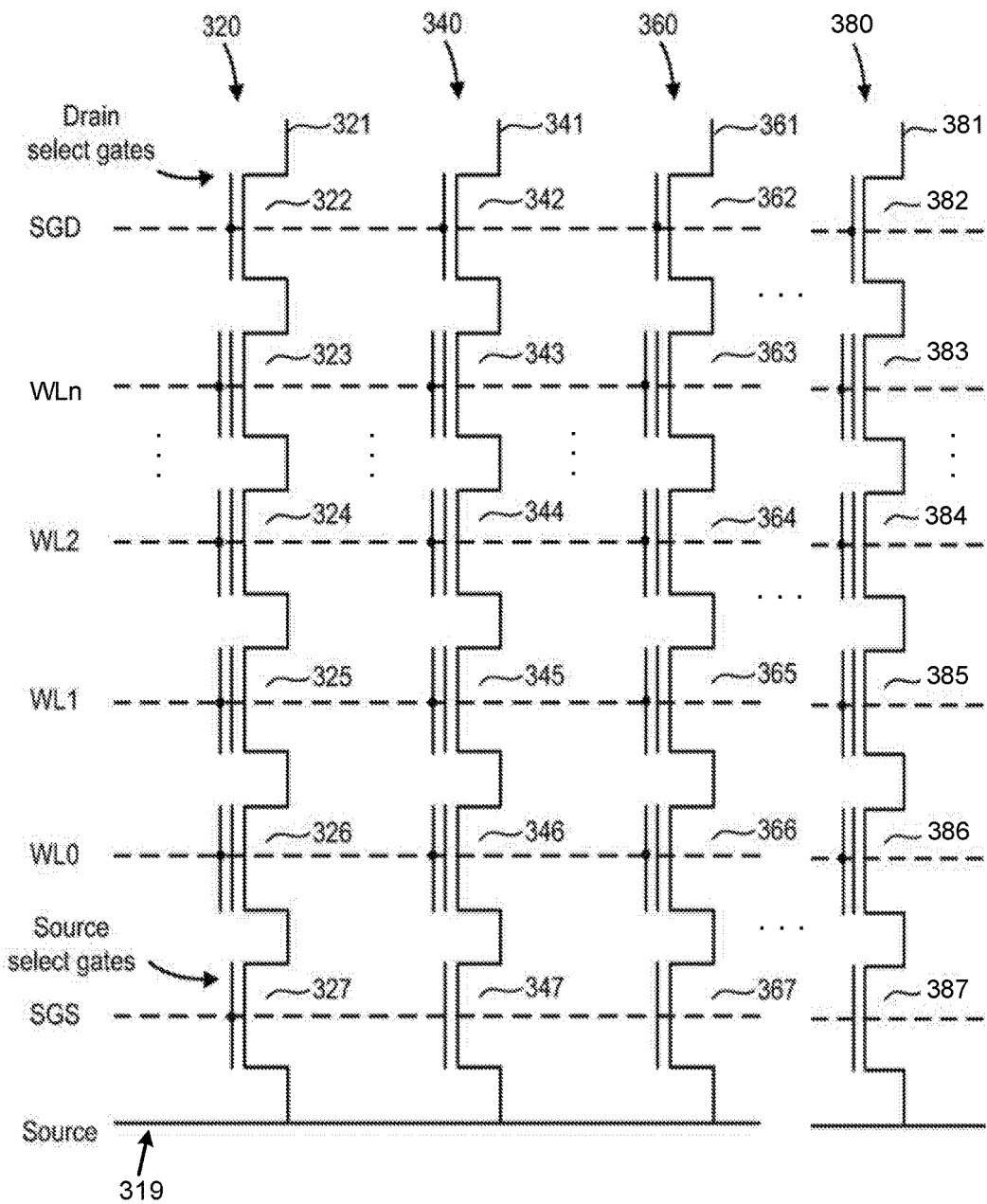
FIG. 3 is a schematic block diagram illustrating one embodiment of an array of storage cells.

FIG. 3 is a circuit diagram depicting a plurality of NAND strings 320, 340, 360, 380. An architecture for a flash memory system using a NAND structure may include several NAND strings 320, 340, 360, 380. For example, FIG. 3 illustrates NAND strings 320, 340, 360, 380 in a memory array 200 that includes multiple NAND strings 320, 340, 360, 380. In the depicted embodiment, each NAND string 320, 340, 360, 380 includes drain select transistors 322, 342, 362, 382, source select transistors 327, 347, 367, 387, and storage elements 323-326, 343-346, 363-366, 383-386. While four storage elements 323-326, 343-346, 363-366, 383-386 per NAND string 320, 340, 360, 380 are illustrated for simplicity, some NAND strings 320, 340, 360, 380 can include any number of storage elements, e.g., thirty-two, sixty-four, or the like storage elements.

NAND strings 320, 340, 360, 380, in one embodiment, are connected to a source line 319 by source select transistors 327, 347, 367, 387. A selection line SGS may be used to control the source side select transistors. The various NAND strings 320, 340, 360, 380, in one embodiment, are connected to bit lines 321, 341, 361, 381 by drain select transistors 322, 342, 362, 382. The drain select transistors 322, 342, 362, 382 may be controlled by a drain select line SGD. In some embodiments, the select lines do not necessarily need to be in common among the NAND strings 320, 340, 360, 380; that is, different select lines can be provided for different NAND strings 320, 340, 360, 380.

As described above, each word line WL0-WLn comprises one or more storage elements 323-383, 324-384, 325-385, 326-386. In the depicted embodiment, each bit line 321, 341, 361, 381 and the respective NAND string 320, 340, 360, 380 comprise the columns of the memory array 200, storage block, erase block, or the like. The word lines WL0-WLn, in some embodiments, comprise the rows of the memory array 200, storage block, erase block, or the like. Each word line WL0-WLn, in some embodiments, connects the control gates of each storage element 323-383, 324-384, 325-385, 326-386 in a row. Alternatively, the control gates may be provided by the word lines WL0-WLn themselves. In some embodiments, a word line WL0-WLn may include tens, hundreds, thousands, millions, or the like of storage elements 323-383, 324-384, 325-385, 326-386.

In one embodiment, each storage element 323-326, 343-346, 363-366, 383-386 is configured to store data. For example, when storing one bit of digital data, the range of possible threshold voltages ("VTH") of each storage element 323-326, 343-346, 363-366, 383-386 may be divided into two ranges which are assigned logical data "1" and "0." In one example of a NAND type flash memory, the VTH may be negative after the storage elements 323-326, 343-346, 363-366, 383-386 are erased, and defined as logic "1." In one embodiment, the VTH after a program operation is positive and defined as logic "0."

When the VTH is negative and a read is attempted, in some embodiments, storage elements 323-326, 343-346, 363-366, 383-386 will turn on to indicate logic "1" is being stored. When the VTH is positive and a read operation is attempted, in a further embodiment, a storage element will not turn on, which indicates that logic "0" is stored. Each storage element 323-383, 324-384, 325-385, 326-386 may also store multiple levels of information, for example, multiple bits of digital data. In such an embodiment, the range of VTH value is divided into the number of levels of data. For example, if four levels of information can be stored in each storage element 323-326, 343-346, 363-366, 383-386, there will be four VTH ranges assigned to the data values "11", "10", "01", and "00."

In one example of a NAND type memory, the VTH after an erase operation may be negative and defined as "11." Positive VTH values may be used for the states of "10", "01", and "00." In one embodiment, the specific relationship between the data programmed into the storage elements 323-326, 343-346, 363-366, 383-386 and the threshold voltage ranges of the storage elements 323-326, 343-346, 363-366, 383-386 depends upon the data encoding scheme adopted for the storage elements 323-326, 343-346, 363-366, 383-386.

In some embodiments, when an erase operation is performed, a time that an erase voltage may be applied to on one or more storage elements 323-326, 343-346, 363-366, 383-386 may be excessive, which may be a result of different erase speeds of the one or more storage elements 323-326, 343-346, 363-366, 383-386. In such an embodiment, the erase depth control component 150 may adjust an erase profile applied to the one or more storage elements 323-326, 343-346, 363-366, 383-386 based on different erase speeds of the one or more storage elements 323-326, 343-346, 363-366, 383-386.

Figure 4:
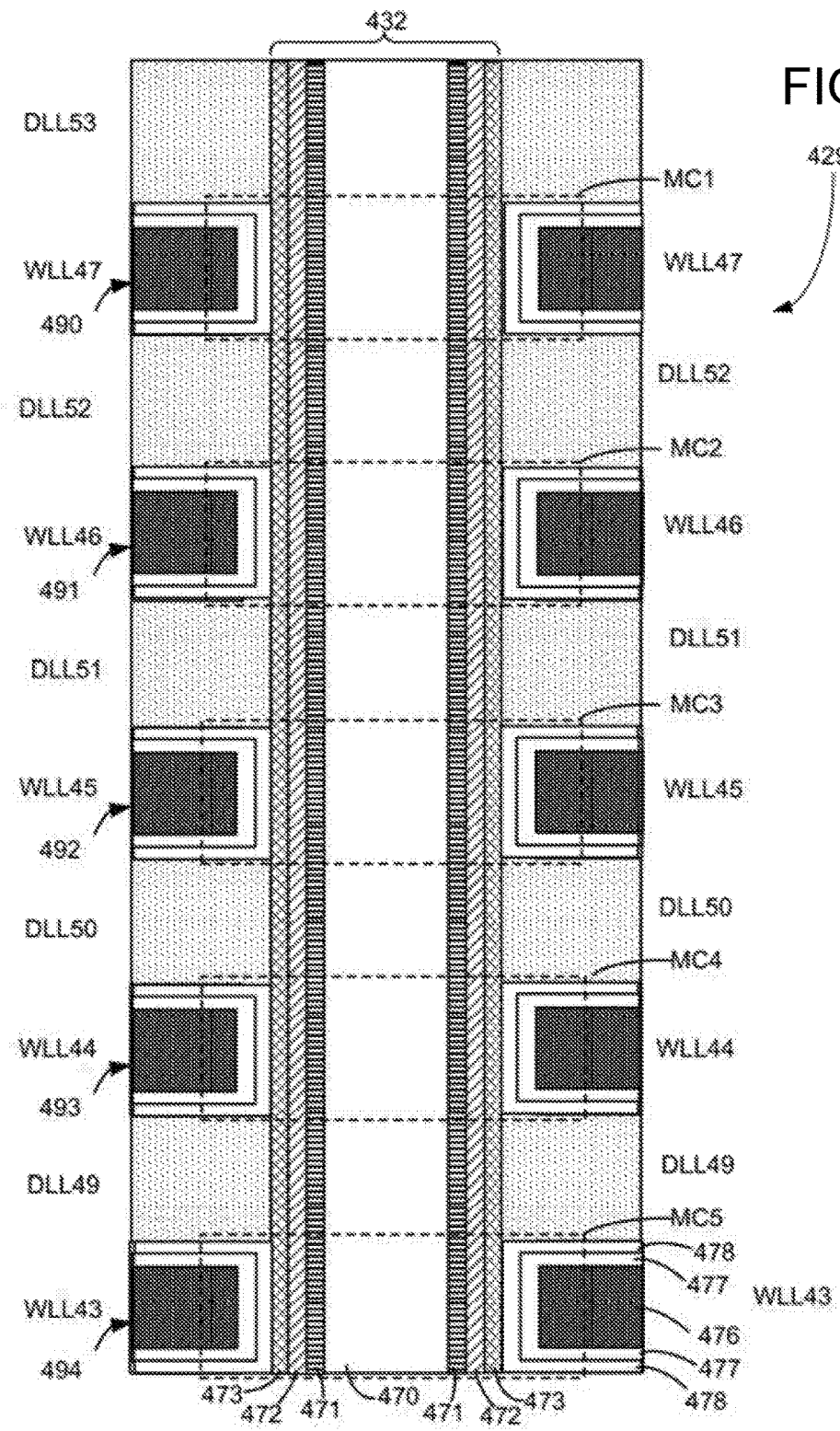
FIG. 4 illustrates one embodiment of a 3D, vertical NAND flash memory structure.

FIG. 4 illustrates one embodiment of a cross sectional view of a 3D, vertical NAND flash memory structure 429 or string 429. In one embodiment, the vertical column 432 is round and includes four layers; however, in other embodiments more or less than four layers can be included and other shapes can be used (e.g., a "U" shape instead of an "I" shape or the like). In one embodiment, a vertical column 432 includes an inner core layer 470 that is made of a dielectric, such as SiO2. Other materials can also be used. Surrounding inner core 470 is polysilicon channel 471. Materials other than polysilicon can also be used. Note that it is the channel 471 that connects to the bit line. Surrounding channel 471 is a tunneling dielectric 472. In one embodiment, tunneling dielectric 472 has an ONO structure. Surrounding tunneling dielectric 472 is a shared charge trapping layer 473, such as (for example) Silicon Nitride. Other materials and structures can also be used. The technology described herein is not limited to any particular material or structure.

FIG. 4 depicts dielectric layers DLL49, DLL50, DLL51, DLL52 and DLL53, as well as word line layers WLL43, WLL44, WLL45, WLL46, and WLL47. Each of the word line layers includes a word line region 476 surrounded by an aluminum oxide layer 477, which is surrounded by a blocking oxide (SiO2) layer 478. The physical interaction of the word line layers with the vertical column forms the memory cells. Thus, a memory cell, in one embodiment, comprises channel 471, tunneling dielectric 472, charge trapping layer 473 (e.g., shared with other memory cells), blocking oxide layer 478, aluminum oxide layer 477 and word line region 476. In some embodiments, the blocking oxide layer 478 and aluminum oxide layer 477, may be replaced by a single layer of material with insulating properties or by more than 2 layers of different material with insulating properties. Furthermore, the materials used are not limited to silicon dioxide (SiO2) or aluminum oxide. For example, word line layer WLL47 and a portion of vertical column 432 comprise a memory cell MC1. Word line layer WLL46 and a portion of vertical column 432 comprise a memory cell MC2. Word line layer WLL45 and a portion of vertical column 432 comprise a memory cell MC3. Word line layer WLL44 and a portion of vertical column 432 comprise a memory cell MC4. Word line layer WLL43 and a portion of vertical column 432 comprise a memory cell MC5. In other architectures, a memory cell may have a different structure; however, the memory cell would still be the storage unit.

When a memory cell is programmed, electrons are stored in a portion of the charge trapping layer 473 which is associated with the memory cell. These electrons are drawn into the charge trapping layer 473 from the channel 471, through the tunneling dielectric 472, in response to an appropriate voltage on word line region 476. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as gate induced drain leakage (GIDL).

Storage cells in the same location or position in different memory structures 429 (e.g., different NAND strings 429) on different bit lines, in certain embodiments, may be on the same word line. Each word line may store one page of data, such as when 1-bit of data is stored per cell (SLC); two pages of data, such as when 2-bits of data are stored per cell (MLC); three pages of data, such as when 3-bits of data are stored per cell (TLC); four pages of data, such as when 4-bits of data are stored per cell (QLC); or another number of pages of data.

In the depicted embodiment, a vertical, 3D NAND flash memory structure 429 comprises an "I" shaped memory structure 429. In other embodiments, a vertical, 3D NAND flash memory structure 429 may comprise a "U" shaped structure, or may have another vertical and/or stacked architecture. In certain embodiments, four sets of strings 429 (e.g., four sets of 48 word lines, or another predefined number of word lines) may form an erase block, while in other embodiments, fewer or more than four sets of strings 429 may form an erase block. As may be appreciated, any suitable number of storage cells may be part of a single string 429. In one embodiment, a single string 429 includes 48 storage cells.

Figure 5:
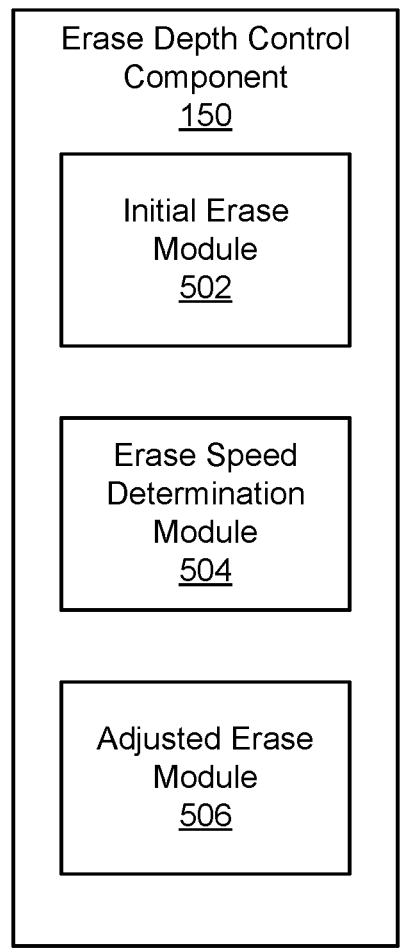
FIG. 5 is a schematic block diagram illustrating one embodiment of an erase depth control component.

FIG. 5 depicts one embodiment of an erase depth control component 150. The erase depth control component 150 may be substantially similar to the erase depth control component 150 described above with regard to FIGS. 1A, 1B, 2, and/or 3. In general, as described above, the erase depth control component 150 determines an erase profile for a memory cell based on a prior erase of the memory cell and performs an erase on the memory cell using the determined erase profile. In the depicted embodiment, the erase depth control component 150 includes an initial erase module 502, an erase speed determination module 504, and an adjusted erase module 506.

In various embodiments, the initial erase module 502 performs a first erase operation on a block of non-volatile storage cells using a first voltage applied for a first time period and verified using a pre-erase verify voltage threshold. For example, in one embodiment, the initial erase module 502 may perform a first portion of an erase operation on a plurality of word lines using a first voltage profile and the initial erase module 502 may perform a first erase verify on the plurality of word lines using a pre-erase verify voltage profile. The pre-erase verify voltage profile and/or the pre-erase verify voltage may comprise a pre-erase verify voltage threshold used to verify whether one or more storage cells have been erased to the pre-erase verify voltage threshold.

A pre-erase verify voltage threshold, as used herein, comprises a voltage level above an erase voltage level so that the pre-erase verify voltage threshold is satisfied by a storage cell before an erase verify voltage threshold is satisfied by the storage cell, as the storage cell is being erased. For example, the initial erase module 502 may apply a pre-erase verify voltage threshold (e.g., PRE_EVFY) to control gates (e.g., a word line) of storage cells while applying a pass-gate voltage (e.g., Vpass) to other control gates (e.g., other word lines) of the same erase block during an erase verify operation. The initial erase module 502 may perform erase verify operations multiple times (e.g., after each erase pulse, after a predefined number of erase pulses, or the like) until at least a predefined number of cells (e.g., all cells, substantially all cells, a predefined percentage or ratio of cells, or the like of a word line, erase block, or the like) satisfy a selected pre-erase verify voltage threshold by determining which storage cells are conductive during application of the selected pre-erase verify voltage threshold (e.g., have threshold voltages below the selected pre-erase verify voltage threshold).

In response to the initial erase module 502 determining that an erase block of storage cells satisfies a selected pre-erase verify voltage threshold, in one embodiment, the erase speed determination module 504 performs another erase verify operation using a different verify voltage threshold (e.g., an erase verify voltage threshold associated with and/or defining an erase state for the block of storage cells, a different pre-erase verify voltage threshold that is lower than the selected pre-erase verify voltage threshold used by the initial erase module 502, or the like). The erase speed determination module 504 described below may determine which storage cells are conductive during application of the different verify voltage threshold (e.g., have threshold voltages below the different verify voltage threshold) and therefore have a faster erase speeds and/or lower erase duration times, and which storage cells are not conductive (e.g., have threshold voltages above the different verify voltage threshold, a failed bit count, or the like) and therefore have slower erase speeds and/or higher erase duration times. Later (e.g., for a second erase operation, a second portion of an erase operation, or the like), the adjusted erase module 506 may use an erase verify voltage threshold (e.g., EVFY, associated with and/or defining an erase state for the storage cells) in a similar manner to verify that one or more storage cells have been erased (e.g., satisfy the erase verify voltage threshold).

For example, the initial erase module 502 may perform a first erase operation and/or a first portion of an erase operation until a failed bit count (e.g., a number of storage cells that do not satisfy a selected pre-erase verify voltage threshold) satisfies a threshold (e.g., is below a predefined threshold number) then transition to the adjusted erase module 506 which may perform a second erase operation and/or a second portion of an erase operation until a different failed bit count (e.g., a number of storage cells that do not satisfy an erase verify voltage threshold) satisfies a threshold (e.g., is below a predefined threshold number). The erase speed determination module 504, as described below, may determine an erase speed and/or an erase duration time based on an erase verify operation (e.g., for a first erase operation and/or a first portion of an erase operation by the initial erase module 502, for a second erase operation and/or a second portion of an erase operation performed by the adjusted erase module 506, between first and second erase operations or portions of an erase operation, or the like). In an embodiment where the erase speed determination module 504 determines an erase speed and/or an erase duration time based on a second erase operation and/or a second portion of an erase operation, the erase speed determination module 504 may cooperate with the adjusted erase module 506 to adjust a subsequent erase operation, after the second erase operation and/or second portion of an erase operation is complete or the like.

As used herein, an erase operation for a block of non-volatile storage cells comprises a process for changing a state of one or more of the non-volatile storage cells of the block to a predefined state (e.g., an erase state, a pre-erase state, toward an erase state, or the like). An erase operation, in one embodiment, may be executed using a single erase command (e.g., applying one or more electrical pulses of one or more voltage levels to the block of non-volatile storage cells until the single erase operation either succeeds or fails, an iterative step pulse erase operation, or the like). In a further embodiment, an erase operation may be executed using multiple commands, such as a first command that erases at least a portion of an erase block to a pre-erase verify voltage threshold and a second command that erases at least a portion of the erase block to an erase verify voltage threshold, or the like. In this manner, in certain embodiments, a first and second erase operation may both be part of a single larger erase operation (e.g., a first set of one or more erase pulses and a second set of one or more erase pulses, or the like).

Portions of an erase operation, as used herein, each comprise one or more erase pulses of the erase operation, such that a verify operation may be performed between the portions of the erase operation using a pre-erase verify voltage threshold. Different portions of an erase operation, in one embodiment, may be performed in response to different erase commands (e.g., a first erase command to erase storage cells to a pre-erase verify voltage threshold and a second command to erase storage cells to an erase verify voltage threshold, or the like). In a further embodiment, different portions of an erase operation may be performed in response to a single erase command, configured to use at least two different verify voltage thresholds, such as a pre-erase verify voltage threshold and an erase verify voltage threshold, or the like.

An erase operation may include N number of pulses (e.g., a maximum loop count of 16 or the like). A loop count N, in certain embodiments, may be set high enough to ensure that an operation successfully completes, and the erase depth control component 150 may adjust the erase operation while it is being performed. Each iteration of applying an increased voltage to erase cells may be referred to as a loop (e.g., an erase loop, or the like). On each iteration, the erase block, page, or other set of storage cells receives an electric pulse with a predefined voltage. For an erase operation, each pulse may be configured to push electrons out of the floating gate. Each iteration or pulse may be applied for a fixed time period or predetermined duration (e.g., 600-700 microseconds or the like), which may be referred to as the pulse width. The voltage applied during an operation may be configured to gradually increase (e.g., ramp up) during the first pulse of an operation. After each pulse is applied to storage cells, a read may be performed on the storage cells to determine whether a verify voltage threshold has been reached and/or passed (e.g., an erase verify operation). For example, as described above, the pre-erase verify voltage threshold may be used initially to determine when the storage cells are close to, or approaching being erased, and an erase verify voltage threshold may be used later to determine when the storage cells are erased.

Figure 7:
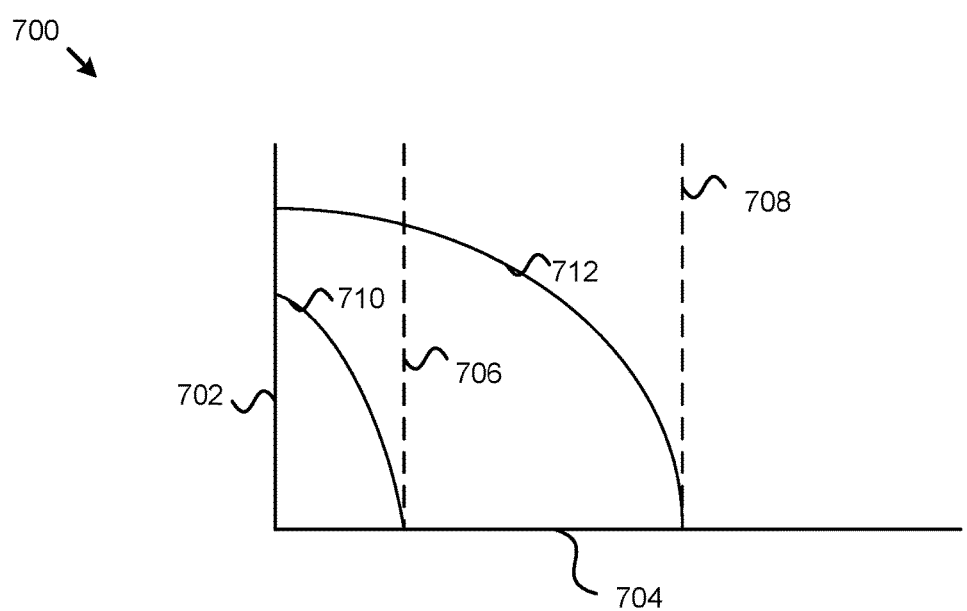
FIG. 7 is a graph illustrating one embodiment of erase verify voltage thresholds used for erase depth control.

Turning to FIG. 7, a graph 700 illustrates one embodiment of erase verify voltage thresholds 706, 708 used for erase depth control. A number of bits and/or storage cells 702 is illustrated on the y-axis and a voltage 704 is illustrated on the x-axis. The curves 710, 712 illustrate a number of storage cells 702 that store a voltage above a corresponding voltage threshold 704 at different points in time. An erase verify voltage threshold 706 and a pre-erase verify voltage threshold 708 are also illustrated. A curve 712 represents voltage levels (e.g., storage cell threshold voltages, stored charge levels, encoded bits, or the like) of the storage cells at a time when the storage cells satisfy the pre-erase verify voltage 708 in an erase verify operation (e.g., a pre-erase verify operation). A curve 710 represents voltage levels (e.g., storage cell threshold voltages, stored charge levels, encoded bits, or the like) of the storage cells at a time when the storage cells satisfy the erase verify voltage threshold 706 in an erase verify operation (e.g., an erase verify operation after a previous pre-erase verify operation).

In one embodiment, the curve 712 and the curve 710 represent the same set of storage cells (e.g., an erase block, a word line, a die, a die plane, a chip, or other set of storage cells) at different points in time. The curve 712, for example, may represent a state of the storage cells after one or more erase pulses of an erase operation, in response to the storage cells satisfying the pre-erase verify voltage threshold 708, or the like, and the curve 710 may represent a state of the same storage cells after one or more additional erase pulses of the erase operation, in response to the storage cells satisfying the erase verify voltage threshold 706, or the like.

Accordingly, storage cells that have a faster erase speed and/or shorter erase duration time than other storage cells may reach the pre-erase verify voltage threshold 708 before the other cells. In one embodiment, the pre-erase verify voltage threshold 708 may have a higher magnitude than the erase verify voltage threshold 706. For example, the pre-erase verify voltage threshold 708 may be approximately 1.5 volts and the erase verify voltage threshold 706 may be approximately 0.5 volts, or the like. In certain embodiments, the pre-erase verify voltage threshold 708 may be a sum of the erase verify voltage threshold 706 and half of a voltage difference between a voltage to erase a storage cell (or word line) with a fastest/shortest erase time and a voltage to erase a storage cell (or word line) with a slowest/longest erase time, or the like.

Returning to FIG. 5, in certain embodiments, the erase speed determination module 504 may determine a first set of storage cells of a block of non-volatile storage cells having a lower erase duration time and/or faster erase speed than a second set of storage cells of the block based on a first erase operation (e.g., a pre-erase verify voltage threshold of a first erase operation) performed by the initial erase module 502. An erase speed, as used herein, may comprise a rate at which a state of one or more storage cells changes during an erase operation (e.g., how fast a charge level, threshold voltage, stored read voltage level, or the like of the one or more storage cells moves toward an erase state). As used herein, an erase duration time of one or more storage cells may be a length of time that it takes for the one or more storage cells to reach a predefined threshold during an erase operation (e.g., a pre-erase verify voltage threshold, an erase voltage threshold, or the like).

For example, in certain embodiments, an erase duration time for a word line, erase block, die, die plane, chip, or other set of multiple storage cells may comprise an amount of time that passes from when an erase operation is initiated and a time when at least a predetermined number of storage cells satisfy an erase threshold (e.g., have a threshold voltage level or stored charge level in a predefined erase state or abode). For a storage cell, in one embodiment, an erase duration time may comprise an amount of time from when an initial erase voltage is applied to the cell and when a threshold voltage level or stored charge level satisfies an erase threshold (e.g., in a predefined erase state or abode, a pre-erase verify voltage threshold, an erase verify voltage threshold, or the like). Similarly, an erase speed may be a rate at which a state of a storage cell, word line, erase block, die plane, die, and/or chip moves toward an erase threshold such as a pre-erase verify voltage threshold, an erase verify voltage threshold, another erase threshold, or the like.

Moreover, being based on an erase operation (e.g., a first erase operation, a second erase operation, a portion of an erase operation, or the like), in certain embodiments, may mean that information obtained, monitored, measured, and/or identified as a result of the erase operation (e.g., an erase verify operation performed during or after an erase operation or portion thereof) may be used to make such determinations described herein. For example, being based on a first erase operation, in one embodiment, may mean being based on whether one or more cells satisfy a pre-erase verify voltage threshold and/or an erase verify voltage threshold, being based on a second erase operation, in certain embodiments, may mean being based on whether one or more cells satisfy a different pre-erase verify voltage threshold and/or an erase verify voltage threshold, or the like. In some embodiments, the erase speed determination module 504 may determine a third set of storage cells of the block of non-volatile storage cells having a longer erase duration time and/or a slower erase speed than the second set of storage cells of the block of non-volatile storage cells based on the first erase operation performed by the initial erase module 502 (e.g., by performing an erase verify operation after the first erase operation has been verified using a pre-erase verify voltage threshold or the like). In such embodiments, the erase speed determination module 504 may determine to use a different voltage for the third set of storage cells than for the first and second sets of storage cells during a second erase operation or other subsequent erase operation.

In various embodiments, the erase speed determination module 504 may determine a first group of word lines of a plurality of word lines of a block of non-volatile storage cells having a lower threshold voltage than a second group of word lines of the plurality of word lines based on a first erase verify (e.g., a pre-erase verify). As used herein, a threshold voltage may refer to a voltage applied to a control gate of a storage cell at which the storage cell becomes conductive. For example, a threshold voltage may comprise a stored read voltage or charge level, or the like of one or more storage cells. In certain embodiments, an erase threshold voltage may comprise a read voltage threshold set at or above a boundary of an erase state or abode for one or more storage cells. For example, for one embodiment of NAND storage cells, an erase state has a negative stored voltage or charge level, so the erase threshold voltage may be set at or around zero volts. As described below, a pre-erase verify voltage threshold may be set above an erase threshold voltage, allowing the erase speed determination module 504 to determine which storage cells are approaching the erase threshold voltage more quickly relative to other storage cells (e.g., based on the first erase verify). In other embodiments, the erase speed determination module 504 may determine which storage cells are approaching the erase threshold voltage based on a verify operation using an erase verify voltage threshold (e.g., an upper boundary of an erase state, an erase threshold voltage, and/or another verify voltage threshold associated with and/or defining an erase state). In some embodiments, the erase speed determination module 504 may determine a third group of word lines of the plurality of word lines having a higher threshold voltage than the second group of word lines of the plurality of word lines based on the first erase verify.

Figure 8:
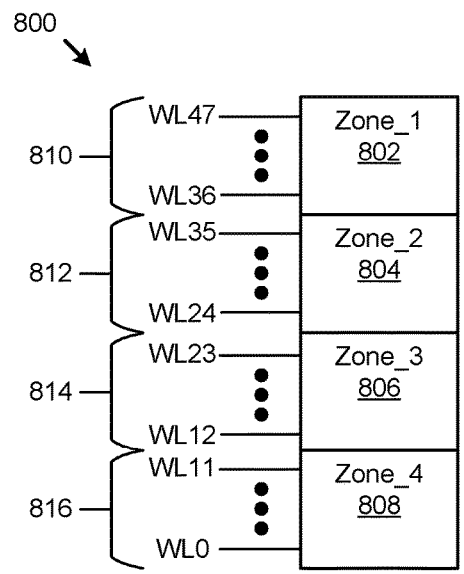
FIG. 8 is a schematic block diagram illustrating one embodiment of zone speed identification for erase depth control.

For example, the erase speed determination module 504 may perform operations corresponding to FIG. 8. Specifically, referring to FIG. 8, a schematic block diagram 800 having one embodiment of zone speed identification for erase depth control is illustrated. In the illustrated embodiment, a block of non-volatile storage cells includes word lines grouped into four different zones. Specifically, word lines 36 through 47 are grouped into zone_1 802, word lines 24 through 35 are grouped into zone_2 804, word lines 12 through 23 are grouped into zone_3 806, and word lines 0 through 11 are grouped into zone_4 808. After the initial erase module 502 verifies that one or more word lines have storage cells that store voltages (e.g., have threshold voltages) below the pre-erase verify voltage threshold 708, an erase verify voltage 810 (e.g., the erase verify voltage threshold 706) may be applied to zone_1 802 while a read voltage 812, 814, 816 is applied to zone_2 804, zone_3 806, and zone_4 808. A failed bit count ("FBC") for zone_1 802 may be determined in response to applying the erase verify voltage 810 to zone_1 802. The FBC may be compared to a threshold to determine whether zone_1 802 is considered a fast erase zone or a slow erase zone. For example, if the FBC is greater than the threshold, zone_1 802 may be considered a slow erase zone, and if the FBC is less than the threshold, zone_1 802 may be considered a fast erase zone. A FBC for each of the remaining zones (e.g., zone_2 804, zone_3 806, and zone_4 808) may also be determined by applying an erase verify voltage to a desired zone and by applying a read voltage to the other zones. Using the FBC for each zone, each zone may be classified as either a slow erase zone or a fast erase zone. As used herein, a failed bit count may refer to a number of storage cells that are above a threshold voltage (e.g., the erase verify voltage threshold 706, 810, the pre-erase verify voltage threshold 708, or the like) at a period of time. In other embodiments, a different, second, lower pre-erase voltage threshold 708 may be used by the erase speed determination module 504 instead of the erase verify voltage threshold 706, 810 using the same process described above.

In certain embodiments, zones may be classified into three different speeds. For example, there may be fast erase zones, intermediate erase zones, and slow erase zones. In such embodiments, the FBC of a zone may be compared against a first threshold and a second threshold, with the first threshold being less than the second threshold. If the FBC of a zone is less than the first threshold, the zone may be considered a fast erase zone. Moreover, if the FBC of a zone is greater than the second threshold, the zone may be considered a slow erase zone. Furthermore, if the FBC of a zone is greater than the first threshold and less than the second threshold, the zone may be considered an intermediate zone.

In some embodiments, zones may be classified into three or more different speeds using one or more failed bit count thresholds and two or more different erase verify voltages, such as a first erase verify voltage threshold that is less than a second erase verify voltage threshold or the like. In such embodiments, if the FBC of a zone using a first erase verify voltage is less than a threshold, the zone may be considered a fast erase zone. Moreover, if the FBC of a zone using the second erase verify voltage is greater than the threshold, the zone may be considered a slow erase zone. Furthermore, if the FBC of a zone using the first erase verify voltage is greater than the threshold and the FBC of the zone using the second erase verify voltage is less than the threshold, the zone may be considered an intermediate erase zone.

Figures 9A, 9B:
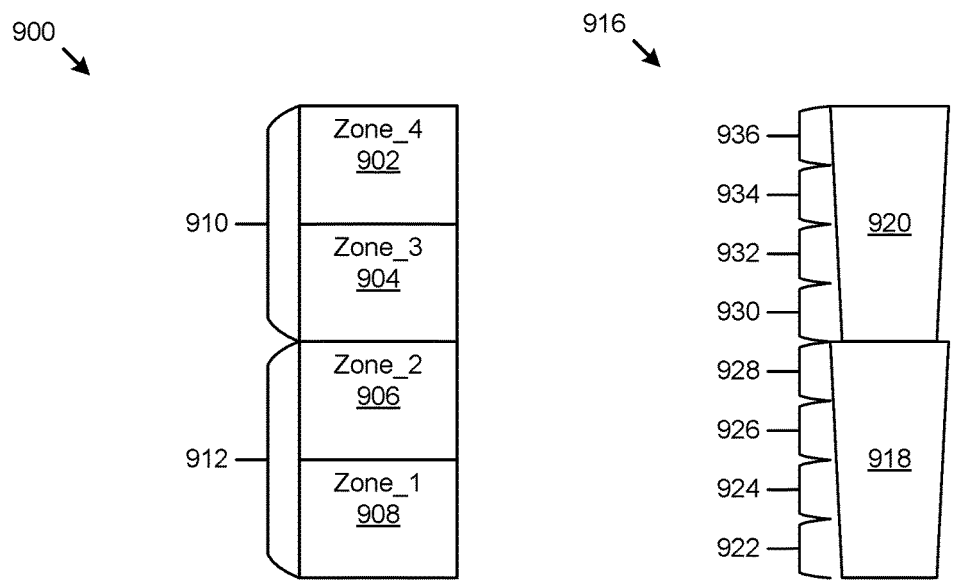
FIG. 9A is a schematic block diagram illustrating another embodiment of zone speed identification for erase depth control.
FIG. 9B is a schematic block diagram illustrating a further embodiment of zone speed identification for erase depth control.

As another example, the erase speed determination module 504 may perform operations corresponding to FIG. 9A. Specifically, referring to FIG. 9A, a schematic block diagram 900 having another embodiment of zone speed identification for erase depth control is illustrated. In the illustrated embodiment, a block of non-volatile storage cells includes word lines grouped into four different zones. Specifically, the storage cells are grouped into zone_4 902, zone_3 904, zone_2 906, and zone_1 908. After the initial erase module 502 verifies that one or more word lines have storage cells that store voltages below the pre-erase verify voltage threshold 708, an erase verify voltage 910 (e.g., the erase verify voltage threshold 706) may be applied to a group including zone_4 902 and zone_3 904 while a read voltage 912 is applied to a group including zone_2 906 and zone_1 908. A failed bit count ("FBC") for the group including zone_4 902 and zone_3 904 may be determined in response to applying the erase verify voltage 910 to the group including zone_4 902 and zone_3 904. The FBC may be compared to a threshold to determine whether the group including zone_4 902 and zone_3 904 is considered a fast erase group or a slow erase group. For example, if the FBC is greater than a threshold, the group including zone_4 902 and zone_3 904 may be considered a slow erase group, and if the FBC is less than the threshold, the group including zone_4 902 and zone_3 904 may be considered a fast erase group. An FBC for each of the remaining groups (e.g., the group including zone_2 906 and zone_1 908) may also be determined by applying an erase verify voltage to a desired group and by applying a read voltage to the other groups. Using the FBC for each group, each group may be classified as either a slow erase group or a fast erase group. Moreover, as described in relation to FIG. 8, zones and/or groups may be classified as fast, intermediate, or slow.

While in certain embodiments, such as is illustrated in FIG. 9A, zones may be put into a group with an adjacent zone, in other embodiments, zones may be grouped in any suitable way. For example, zone_4 902 and zone_2 906 may be grouped together, and zone_3 904 and zone_1 908 may be grouped together. In some embodiments, every fourth zone may be grouped together. In certain embodiments, only one zone from a group has an FBC that is determined and compared against one or more thresholds, and all zones in a group are classified based on the one zone that has a determined FBC. Accordingly, not all zones have to have an FBC determined to classify the zones into different speed classifications. In some embodiments, if a group is checked together and the group has a FBC that is higher than a threshold, each individual zone may be checked separately. In contrast, if a group is checked together and the group has an FBC that is lower than the threshold, the zones may all be classified based on the group check.

For example, in one embodiment, zones may be grouped together based on a corresponding geometry and/or architecture of a storage medium. FIG. 9B illustrates an embodiment of zones that may be grouped together based on geometry of a storage medium. Specifically, FIG. 9B illustrates one embodiment of a 3D vertical NAND structure 916, such as a structure described in FIG. 4, in which portions of the structure may repeat. For example, as illustrated, a first portion 918 of the structure 916 may approximately match a second portion 920 of the structure 916. The first and second portions 918, 920 of the structure may each include four zones that correspond to similar geometries. Specifically, the first portion 918 includes a first zone 922, a second zone 924, a third zone 926, and a fourth zone 928. Moreover, the second portion 920 includes a first zone 930, a second zone 932, a third zone 934, and a fourth zone 936. In certain embodiments, because of their similar geometries, the first zones 922, 930 may be grouped together, the second zones 924, 932 may be grouped together, the third zones 926, 934 may be grouped together, and the fourth zones 928, 936 may be grouped together, or the like.

Returning to FIG. 5, in one embodiment, the erase speed determination module 504 may determine a first group of word lines of a plurality of word lines of a block of non-volatile storage cells that has a lower threshold voltage than a second group of word lines of the plurality of word lines based on a first erase verify. In such an embodiment, the erase speed determination module 504 may predict word lines of the plurality of word lines that belong to the first group of word lines, predict word lines of the plurality of word lines that belong to the second group of word lines, and verify the predictions by: performing a second portion of an erase operation for the first group of word lines using a second voltage profile, and performing the second portion of the erase operation for the second group of word lines using a third voltage profile, or the like.

In some embodiments, the adjusted erase module 506 may perform a second erase operation on a block of non-volatile storage cells using different voltages for a first set of storage cells and a second set of storage cells of the block. For example, the adjusted erase module 506 may erase the first group of storage cells during the second erase operation by applying a second voltage for a second time period, and the adjusted erase module 506 may erase the second group of storage cells during the second erase operation by applying a third voltage for the second time period. In certain embodiments, the second voltage may have a lower magnitude than the third voltage.

In various embodiments, the adjusted erase module 506 may perform a second portion of an erase operation on a plurality of word lines of a block of non-voltage storage cells. In such embodiments, a second voltage profile may be used during the second portion of the erase operation for the first group of word lines, a third voltage profile may be used during the second portion of the erase operation for the second group of word lines, and the second voltage profile and third voltage profile may be different. In some embodiments, the adjusted erase module 506 may perform a second erase verify on the plurality of word lines using an erase verify voltage profile.

In certain embodiments, the adjusted erase module 506 uses a fourth voltage profile during the second portion of the erase operation for a third group of word lines, and the second voltage profile, the third voltage profile, and the fourth voltage profile are all different. In one embodiment, the second voltage profile includes applying a first voltage during a first period of the second portion of the erase operation and applying a second voltage greater than the first voltage during a second period of the second portion of the erase operation, the third voltage profile includes applying the first voltage during the first period of the second portion of the erase operation and applying a third voltage greater than the first voltage and less than the second voltage during the second period of the second portion of the erase operation, and the fourth voltage profile comprises applying the first voltage during the first and second periods of the second portion of the erase operation.

Figure 10:
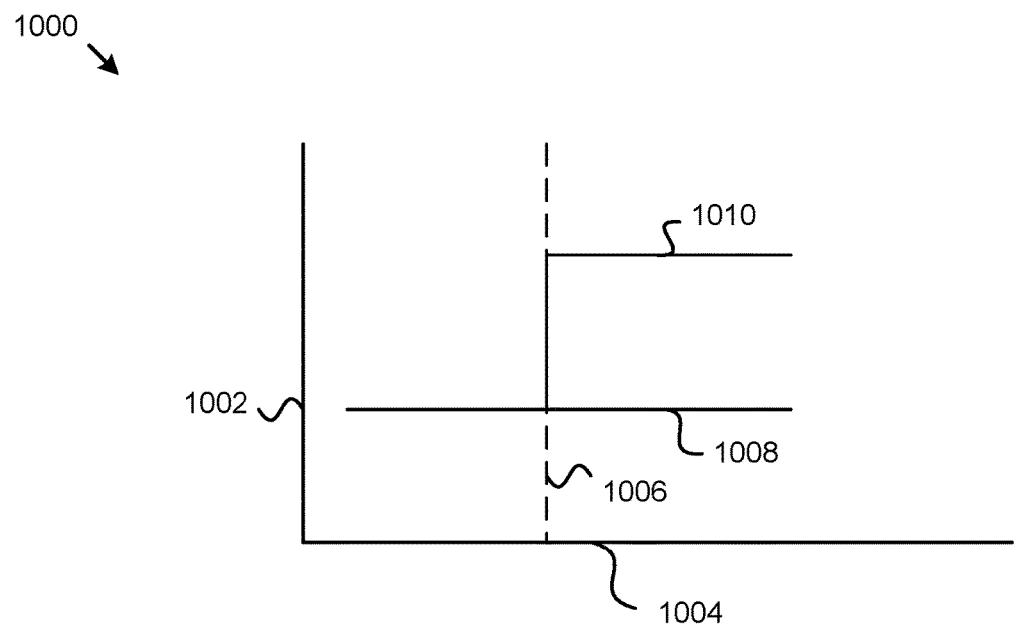
FIG. 10 is a graph illustrating one embodiment of an erase operation for erase depth control.

For example, referring to FIG. 10, a graph 1000 of one embodiment of an erase operation for erase depth control is illustrated. In the illustrated embodiment, a word line erase voltage 1002 (e.g., a bias voltage applied to control gates for adjusting a voltage differential between the control gates and an erase voltage applied to drains/channels of the storage cells through one or more bit lines, wells, and/or source lines, based on an architecture of the storage cells or the like) is illustrated relative to a time 1004. A first time period is separated from a second time period by a pre-erase verify time 1006. As used herein, the pre-erase verify time 1006 may be a point in time during the erase operation at which one or more storage cells store voltages at or below a pre-erase verify voltage threshold. The word line erase voltage 1002 of a first voltage profile 1008 for slow erase zones maintains the same bias voltage before and after the pre-erase verify time 1006. For example, after the pre-erase verify voltage threshold 708 is reached by one or more storage cells, slow erase zones maintain the same word line erase voltage 1002 until the erase operation is completed, so that erasing of the slow erase zones is not inhibited. In contrast, the word line erase voltage 1002 of a second voltage profile 1010 for fast erase zones matches the voltage of the first voltage profile 1008 prior to the pre-erase verify time 1006 (e.g., in order to determine relative erase speeds for the different zones), then, after the pre-erase verify time 1006, a word line bias erase voltage of the second voltage profile 1010 is increased to a higher word line erase voltage 1002 to inhibit/slow further erasing of the fast erase zones.

As described above, the erase speed determination module 504 may perform a pre-erase verify operation between each erase pulse, after a predetermined number of erase pulses, or the like. Depending on the type or architecture of the storage cells, the pre-erase verify time 1006 may differ.

For example, ReRAM, Memristor memory, other resistive type storage cells, and/or other storage or memory technologies, in certain embodiments, may reach a pre-erase verify voltage threshold 708 after a single pulse being applied (e.g., for a first time period), while NAND flash storage cells and/or other storage or memory technologies may reach a pre-erase verify voltage threshold 708 after a series of multiple pulses have been applied (e.g., for a longer first time period).

As used herein, an erase voltage (e.g., a bit line erase voltage applied to drains of storage cells, a bias voltage or word line erase voltage 1002, 1102 applied to control gates of storage cells, a differential voltage between a drain/bit line and a control gate/word line of a storage cell, or the like) may refer to a voltage applied to one or more storage cells (e.g., one or more bit lines of storage cells, one or more word lines of storage cells, an erase block of storage cells, or the like) in order to move the cells toward and/or place the cells in an erase state. For example, in one embodiment, an erase voltage for a block of storage cells may be supplied via a substrate of the block of storage cells (e.g., to drains of the storage cells, to control gates of the storage cells, to sources of the storage cells, as a voltage differential between a drain and a control gate, or the like), applied to one or more word lines or the like. An erase voltage, in one embodiment, may be negative (e.g., a lower voltage applied to a control gate than to a drain for NAND flash, a lower voltage applied to a control gate than to a source for NOR flash, or the like) to induce Fowler-Nordheim tunneling transferring stored charge from the floating gate to the source to erase the storage cells (e.g., about −19.2 volts, a series of discrete negative voltage pulses, or the like). A word line erase voltage 1102, as used herein, may refer to a bias voltage applied to one or more storage cells during an erase operation (e.g., to one or more control gates of NAND flash storage cells via one or more word lines).

In some embodiments, the word line erase voltage 1102 or other bias voltage applied to one or more word lines may be approximately 0 volts prior to the pre-erase verify time 1006 (e.g., with an erase voltage of approximately 19.2 volts or the like applied to the bit lines, wells, and/or source lines), which the first voltage profile 1008 maintains after the pre-erase verify time 1006 and the second voltage profile 1010 increases after the pre-erase verify time 1006 (e.g., to lower the voltage differential between the word line bias voltage and the bit line erase voltage thereby slowing/inhibiting erasing of storage cells associated with the word line). For example, the second voltage profile 1010 may apply a bias voltage of approximately 0.5 volts, 1.0 volts, 1.5 volts, 2.0 volts, 2.5 volts, 3.0 volts, and so forth, lowering the total erase voltage applied to one or more word lines by increasing the bias voltage applied to the one or more word lines to decrease the voltage differential between the bias voltage and a bit line erase voltage applied to storage cells of the one or more word lines. In other embodiments, instead of or in addition to increasing a word line bias voltage to slow/inhibit erasing of one or more storage cells (e.g., word lines of storage cells), the erase depth control component 150 may decrease a bit line erase voltage of one or more storage cells (e.g., bit lines of storage cells), or the like.

Figure 11:
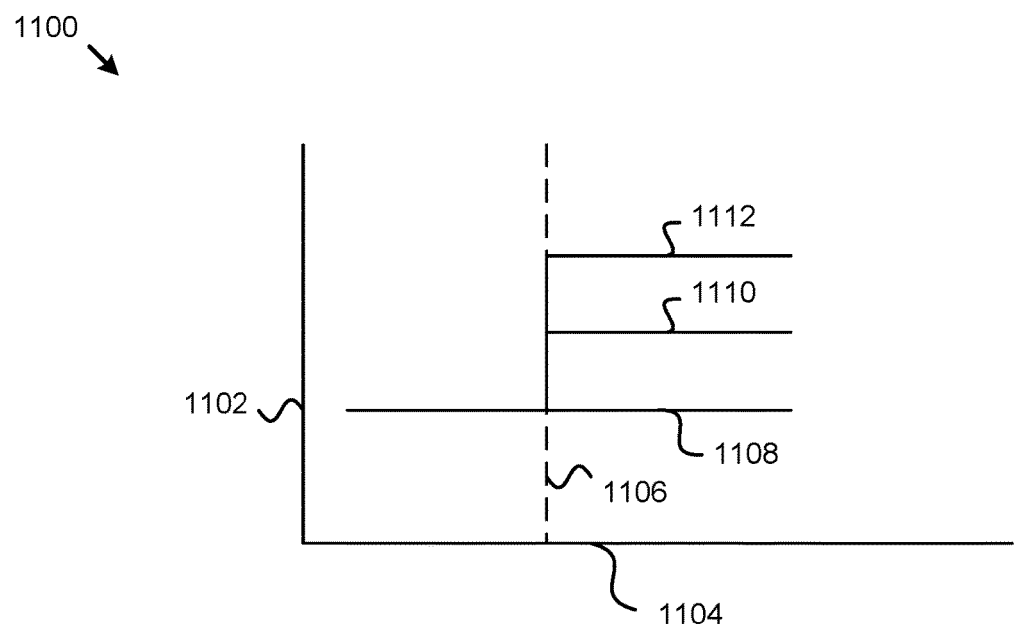
FIG. 11 is a graph illustrating another embodiment of an erase operation for erase depth control.

As another example, referring to FIG. 11, a graph 1100 of another embodiment of an erase operation for erase depth control is illustrated. In the illustrated embodiment, a word line erase voltage 1102 (e.g., a bias voltage) is illustrated relative to a time 1104. A first time period is separated from a second time period by a pre-erase verify time 1106. As used herein, the pre-erase verify time 1106 may be a point in time during the erase operation at which one or more storage cells store voltages at or below a pre-erase verify voltage threshold. The word line erase voltage 1102 (e.g., a bias voltage) of a first voltage profile 1108 for slow erase zones maintains the same voltage before and after the pre-erase verify time 1106, so as not to slow or inhibit storage cells of the slow erase zones.

For example, after the pre-erase verify voltage threshold 708 is reached by one or more storage cells, slow erase zones maintain the same word line erase voltage 1102 (e.g., bias voltage) until the erase operation is completed. In contrast, the word line erase voltage 1102 (e.g., bias voltage) of a second voltage profile 1110 for intermediate erase zones matches the voltage of the first voltage profile 1108 prior to the pre-erase verify time 1106 (e.g., in order to determine the relative erase speeds of the different erase zones), then, after the pre-erase verify time 1106, the second voltage profile 1110 is increased to a higher word line erase voltage 1102 to slow down/inhibit erasing of the intermediate erase zones. Moreover, the word line erase voltage 1102 of a third voltage profile 1112 for fast erase zones matches the voltage of the first voltage profile 1108 prior to the pre-erase verify time 1106 (e.g., in order to determine the relative erase speeds of the different erase zones), then, after the pre-erase verify time 1106, the third voltage profile 1112 is increased to a higher word line erase voltage 1102 to slow down/inhibit further erasing of the fast erase zones even more than the intermediate erase zones. As illustrated after the pre-erase verify time 1106, the third voltage profile 1112 is increased to be higher than the second voltage profile 1110.

Figure 6:
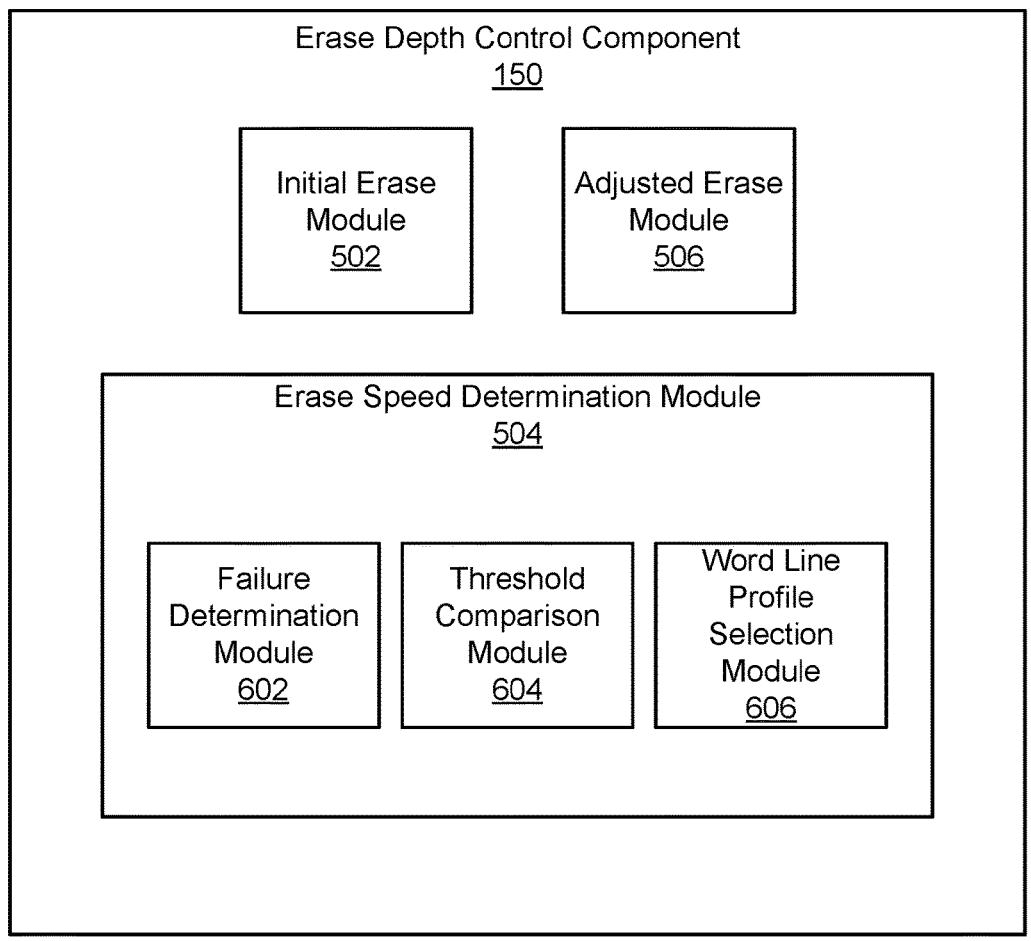
FIG. 6 is a schematic block diagram illustrating a further embodiment of an erase depth control component.

Turning to FIG. 6, a further embodiment of an erase depth control component 150 is illustrated. The erase depth control component 150 may be substantially similar to the erase depth control component 150 described above with regard to FIGS. 1A, 1B, 2, 3, and/or 5. In the depicted embodiment, the erase depth control component 150 includes the initial erase module 502, the erase speed determination module 504, and the adjusted erase module 506 and further includes a failure determination module 602, a threshold comparison module 604, and a word line profile selection module 606.

In one embodiment, the failure determination module 602 may select a portion of a plurality of word lines of a block of non-volatile storage cells and perform a second erase verify on the portion of the plurality of word lines using an erase verify voltage profile to produce a FBC. In some embodiments, the failure determination module 602 may select one or more storage cells and perform a second erase verify on the one or more storage cells using an erase verify voltage profile to produce a FBC.

In one embodiment, the failure determination module 602 may perform a second erase verify on a portion of a plurality of word lines of a block of non-volatile storage cells using a first erase verify voltage profile to produce a first FBC, and may perform a third erase verify on the portion of the plurality of word lines using a second erase verify voltage profile to produce a second FBC. In such embodiments, a voltage of the second erase verify voltage profile may be greater than a voltage of the first erase verify voltage profile.

In certain embodiments, the threshold comparison module 604 may determine whether the FBC for the portion of the plurality of word lines is less than a predetermined threshold. In one embodiment, the threshold comparison module 604 may determine whether the FBC for the portion of the plurality of word lines is less than a first predetermined threshold, and may determine whether the FBC for the portion of the plurality of word lines is greater than a second predetermined threshold. In such embodiments, the second predetermined threshold may be greater than the first predetermined threshold.

In various embodiments, the threshold comparison module 604 may determine whether a first FBC for the portion of the plurality of word lines is less than a predetermined threshold, and may determine whether a second FBC for the portion of the plurality of word lines is greater than the predetermined threshold.

In certain embodiments, the word line profile selection module 606 may assign the portion of the plurality of word lines to a first group of word lines in response to the FBC for the portion of the plurality of word lines being less than the predetermined threshold, and may assign the portion of the plurality of word lines to a second group of word lines in response to the FBC for the portion of the plurality of word lines being greater than the predetermined threshold. In such embodiments, the portion of the plurality of word lines includes one or more zones, and word lines of the plurality of word lines that are not part of the portion of the plurality of word lines are set to a read voltage while performing the second erase verify.

In some embodiments, the word line profile selection module 606 may assign the portion of the plurality of word lines to a first group of word lines in response to the FBC for the portion of the plurality of word lines being less than a first predetermined threshold, may assign the portion of the plurality of word lines to a second group of word lines in response to the FBC for the portion of the plurality of word lines being greater than the first predetermined threshold and less than a second predetermined threshold, and may assign the portion of the plurality of word lines to a third group of word lines in response to the FBC for the portion of the plurality of word lines being greater than the second predetermined threshold.

In one embodiment, the word line profile selection module 606 may assign the portion of the plurality of word lines to a first group of word lines in response to a first FBC for the portion of the plurality of word lines being less than a predetermined threshold, may assign the portion of the plurality of word lines to a second group of word lines in response to the first FBC for the portion of the plurality of word lines being greater than the predetermined threshold and a second FBC for the portion of the plurality of word lines being less than the predetermined threshold, and may assign the portion of the plurality of word lines to a third group of word lines in response to the second FBC for the portion of the plurality of word lines being greater than the predetermined threshold.

Figure 12:
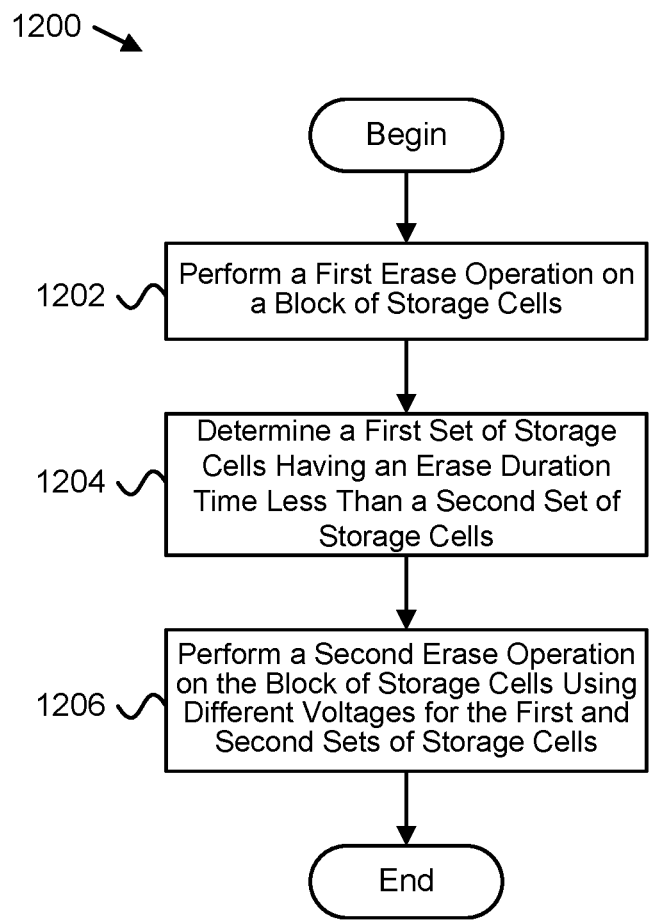
FIG. 12 is a schematic flow chart diagram illustrating one embodiment of a method for erase depth control.

FIG. 12 depicts one embodiment of a method 1200 for erase depth control. The method 1200 may be performed at any point in time, such as at predetermined intervals for calibrating and/or recalibrating a block of non-volatile storage cells. For example, the method 1200 may be performed at a predetermined interval of every 200 program/erase cycles. The method 1200 may also be performed as part of each erase.

The method 1200 begins and the initial erase module 502 performs 1202 a first erase operation on the block of non-volatile storage cells using a first voltage applied for a first time period and a pre-erase verify voltage threshold. The erase speed determination module 504 determines 1204 a first set of storage cells of the block having an erase duration time less than and/or an erase speed faster than a second set of storage cells of the block based on the pre-erase verify voltage threshold. The adjusted erase module 506 performs 1206 a second erase operation on the block of non-volatile storage cells using different voltages for the first set of storage cells and the second set of storage cells of the block, and the method 1200 ends.

Figure 13:
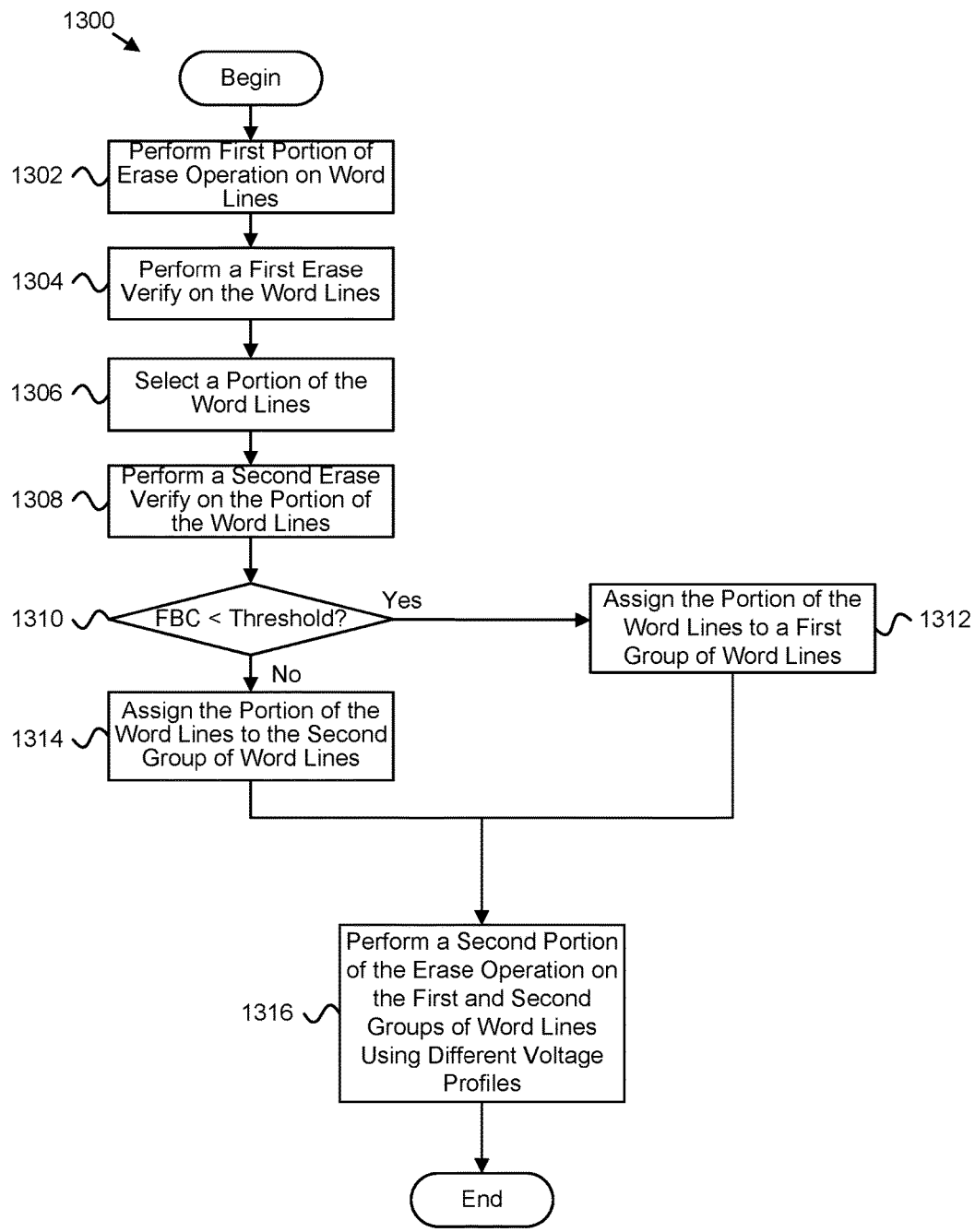
FIG. 13 is a schematic flow chart diagram illustrating a further embodiment of a method for erase depth control.

FIG. 13 is a schematic flow chart diagram illustrating a further embodiment of a method 1300 for erase depth control. The method 1300 begins, and the initial erase module 502 performs 1302 a first portion of an erase operation on a plurality of word lines using a first voltage profile. Moreover, the initial erase module 502 performs 1304 a first erase verify on the plurality of word lines using a pre-erase verify voltage profile. The erase speed determination module 504 selects 1306 a portion of the plurality of word lines.

The erase speed determination module 504 performs 1308 a second erase verify on the portion of the plurality of word lines using an erase verify voltage profile to produce a FBC. The erase speed determination module 504 determines 1310 whether the FBC for the portion of the plurality of word lines is less than a predetermined threshold. If the FBC is less than the predetermined threshold, the erase speed determination module 504 assigns 1312 the portion of the plurality of word lines to the first group of word lines. If the FBC is greater than the predetermined threshold, the erase speed determination module 504 assigns 1314 the portion of the plurality of word lines to the second group of word lines. Then, the adjusted erase module 506 performs 1316 a second portion of the erase operation on the plurality of word lines, and the method 1300 ends. In certain embodiments, a second voltage profile is used during the second portion of the erase operation for the first group of word lines and a third voltage profile is used during the second portion of the erase operation for the second group of word lines, and the second voltage profile and third voltage profile are different.

A means for performing a first erase on a plurality of word lines using a first voltage profile, in various embodiments, may include an erase depth control component 150, an initial erase module 502, a non-volatile storage device interface 139, a non-volatile memory medium controller 126, a storage client 116, a database system 116a, a host computing device 110, a bus 127, a network 115, a device driver, a controller (e.g., a die controller 220, a state machine 222, a controller 244, a device driver, or the like), a sense amplifier 250, a voltage source, a processor 111, other logic hardware, and/or other executable code stored on a computer readable storage medium. Other embodiments may include similar or equivalent means for performing a first erase on a plurality of word lines using a first voltage profile.

A means for performing a first erase verify on the plurality of word lines using a pre-erase verify voltage profile, in various embodiments, may include an erase depth control component 150, an initial erase module 502, a non-volatile storage device interface 139, a non-volatile memory medium controller 126, a storage client 116, a host computing device 110, a bus 127, a network 115, a device driver, a controller (e.g., a die controller 220, a state machine 222, a controller 244, a device driver, or the like), a sense amplifier 250, a voltage source, a processor 111, other logic hardware, and/or other executable code stored on a computer readable storage medium. Other embodiments may include similar or equivalent means for performing a first erase verify on the plurality of word lines using a pre-erase verify voltage profile.

A means for determining a first group of word lines of the plurality of word lines having a shorter erase duration time and/or a faster erase speed than a second group of word lines of the plurality of word lines based on the first erase verify, in various embodiments, may include an erase depth control component 150, an erase speed determination module 504, a non-volatile storage device interface 139, a non-volatile memory medium controller 126, a failure determination module 602, a threshold comparison module 604, a word line profile selection module 606, a storage client 116, a database system 116a, a host computing device 110, a bus 127, a network 115, a device driver, a controller (e.g., a die controller 220, a state machine 222, a controller 244, a device driver, or the like), a processor 111, other logic hardware, and/or other executable code stored on a computer readable storage medium. Other embodiments may include similar or equivalent means for determining a first group of word lines of the plurality of word lines having a shorter erase duration time and/or a faster erase speed than a second group of word lines of the plurality of word lines based on the first erase verify.

A means for performing a second erase operation on the plurality of word lines, in various embodiments, may include an erase depth control component 150, an adjusted erase module 506, a non-volatile storage device interface 139, a non-volatile memory medium controller 126, a storage client 116, a database system 116a, a host computing device 110, a bus 127, a network 115, a device driver, a controller (e.g., a die controller 220, a state machine 222, a controller 244, a device driver, or the like), a sense amplifier 250, a voltage source, a processor 111, other logic hardware, and/or other executable code stored on a computer readable storage medium. Other embodiments may include similar or equivalent means for performing a second erase operation on the plurality of word lines. In certain embodiments, a second voltage profile is used during the second erase operation for the first group of word lines and a third voltage profile is used during the second erase operation for the second group of word lines, and the second voltage profile and third voltage profile are different.

A means for performing a second erase verify on the plurality of word lines using an erase verify voltage profile, in various embodiments, may include an erase depth control component 150, an adjusted erase module 506, a non-volatile storage device interface 139, a non-volatile memory medium controller 126, a storage client 116, a database system 116a, a host computing device 110, a bus 127, a network 115, a device driver, a controller (e.g., a die controller 220, a state machine 222, a controller 244, a device driver, or the like), a sense amplifier 250, a voltage source, a processor 111, other logic hardware, and/or other executable code stored on a computer readable storage medium. Other embodiments may include similar or equivalent means for performing a second erase verify on the plurality of word lines using an erase verify voltage profile. In certain embodiments, a voltage of the pre-erase verify voltage profile comprises a sum of a voltage of the erase verify voltage profile and a voltage delta, and the voltage delta comprises approximately half of a difference between a voltage to erase the first group of word lines and a voltage to erase the second group of word lines.

The present disclosure may be embodied in other specific forms without departing from its spirit or essential characteristics. The described embodiments are to be considered in all respects only as illustrative and not restrictive. The scope of the disclosure is, therefore, indicated by the appended claims rather than by the foregoing description. All changes which come within the meaning and range of equivalency of the claims are to be embraced within their scope.

What is claimed is:

1. An apparatus comprising:
a block of non-volatile storage cells; and
a controller for the block, the controller configured to,
perform a first erase operation on the block of non-volatile storage cells, the first erase operation comprising a first voltage applied as one or more erase pulses;
determine a first set of storage cells of the block having a faster erase speed than a second set of storage cells of the block based on a verify voltage threshold; and
perform a second erase operation on the block of non-volatile storage cells using different voltages for the first set of storage cells and the second set of storage cells of the block, wherein the second erase operation is performed concurrently on the first set of storage cells and the second set of storage cells.

2. The apparatus of claim 1, wherein the controller is configured to:
erase the block of non-volatile storage cells during the first erase operation by applying a first voltage;
erase the first group of storage cells during the second erase operation by applying a second voltage; and
erase the second group of storage cells during the second erase operation by applying a third voltage.

3. The apparatus of claim 2, wherein the second voltage has a lower magnitude than the third voltage.

4. The apparatus of claim 3, wherein the controller lowers the magnitude of the second voltage by applying a higher bias voltage to one or more control gates of the first set of storage cells thereby slowing erasing of the first set of storage cells, the second voltage comprising a voltage differential between one or more drains of the first set of storage cells and the one or more control gates of the first set of storage cells.

5. The apparatus of claim 1, wherein the verify voltage threshold comprises an erase verify voltage threshold for the block of non-volatile storage cells, the erase verify voltage threshold associated with an erase state for the block of non-volatile storage cells.

6. The apparatus of claim 1, wherein the verify voltage threshold comprises a pre-erase verify voltage threshold that is higher than an erase verify voltage threshold for the block of non-volatile storage cells.

7. The apparatus of claim 1, wherein the controller is configured to determine a third set of storage cells of the block of non-volatile storage cells having a slower erase speed than the second set of storage cells of the block of non-volatile storage cells based on the first erase operation and to use a different voltage for the third set of storage cells than for the first and second sets of storage cells during the second erase operation.

8. The apparatus of claim 1, wherein the first erase operation comprises the first voltage applied as a single erase pulse.

9. The apparatus of claim 1, wherein the first erase operation comprises a series of multiple erase pulses.

10. The apparatus of claim 1, wherein the controller comprises hardware of a non-volatile storage device comprising the block of non-volatile storage cells, the hardware of the non-volatile storage device comprising one or more of a storage controller in communication with a plurality of semiconductor chips of non-volatile storage, one of the semiconductor chips comprising the block of non-volatile storage cells, and a state machine on the same semiconductor chip as the block of non-volatile storage cells.

11. An apparatus comprising:
means for performing a first erase on a plurality of word lines using a first voltage profile until a pre-erase verify voltage threshold is satisfied, the first erase comprising a first voltage applied as one or more erase pulses;
means for determining a first group of word lines of the plurality of word lines having a shorter erase duration time than a second group of word lines of the plurality of word lines based on a different erase verify voltage threshold; and
means for performing a second erase on the plurality of word lines using a second voltage profile for the first group of word lines and using a third voltage profile for the second group of word lines, the second voltage profile being different than the third voltage profile, wherein the second erase is performed at a same time on the first group of word lines and the second group of word lines.

12. The apparatus of claim 11, further comprising means for performing an erase verify on the plurality of word lines for the second erase using the different erase verify voltage threshold, wherein the pre-erase verify voltage threshold comprises a sum of the different erase verify voltage threshold and a voltage delta, and the voltage delta comprises approximately half of a difference between a voltage to erase the first group of word lines and a voltage to erase the second group of word lines.

* * * * *